United States Patent
Yamazaki et al.

(10) Patent No.: US 10,186,603 B2
(45) Date of Patent: Jan. 22, 2019

(54) MANUFACTURING METHOD OF SEMICONDUCTOR DEVICE INCLUDING OXYGEN DOPING TREATMENT

(71) Applicant: Semiconductor Energy Laboratory Co., Ltd., Atsugi-shi, Kanagawa-ken (JP)

(72) Inventors: Shunpei Yamazaki, Setagaya (JP); Toshinari Sasaki, Atsugi (JP); Kosei Noda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 221 days.

(21) Appl. No.: 15/232,092

(22) Filed: Aug. 9, 2016

(65) Prior Publication Data

US 2016/0351693 A1 Dec. 1, 2016

Related U.S. Application Data

(63) Continuation of application No. 13/107,283, filed on May 13, 2011, now Pat. No. 9,425,045.

(30) Foreign Application Priority Data

May 21, 2010 (JP) .................................. 2010-117373

(51) Int. Cl.
    *H01L 29/66* (2006.01)
    *H01L 21/02* (2006.01)
    (Continued)

(52) U.S. Cl.
    CPC .. *H01L 29/66969* (2013.01); *H01L 21/02554* (2013.01); *H01L 21/02565* (2013.01);
    (Continued)

(58) Field of Classification Search
    CPC ............ H01L 29/66969; H01L 21/385; H01L 29/7869; H01L 21/02565; H01L 21/02631; H01L 21/02554
    See application file for complete search history.

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

CN 001503368 A 6/2004
CN 101350364 A 1/2009
(Continued)

OTHER PUBLICATIONS

International Search Report (Application No. PCT/JP2011/061125) dated Aug. 16, 2011.
(Continued)

Primary Examiner — John P. Dulka
(74) Attorney, Agent, or Firm — Robinson Intellectual Property Law Office; Eric J. Robinson

(57) ABSTRACT

It is an object to provide a semiconductor device including an oxide semiconductor, which has stable electric characteristics and high reliability. An oxide semiconductor film serving as a channel formation region of a transistor is formed by a sputtering method at a temperature higher than 200° C., so that the number of water molecules eliminated from the oxide semiconductor film can be 0.5/nm³ or less according to thermal desorption spectroscopy. A substance including a hydrogen atom such as hydrogen, water, a hydroxyl group, or hydride which causes variation in the electric characteristics of a transistor including an oxide semiconductor is prevented from entering the oxide semiconductor film, whereby the oxide semiconductor film can
(Continued)

be highly purified and made to be an electrically i-type (intrinsic) semiconductor.

13 Claims, 15 Drawing Sheets

(51) Int. Cl.
  H01L 29/786 (2006.01)
  H01L 21/385 (2006.01)
  H01L 27/12 (2006.01)
(52) U.S. Cl.
  CPC ...... H01L 21/02631 (2013.01); H01L 21/385 (2013.01); H01L 29/7869 (2013.01); H01L 27/1225 (2013.01)

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,864,519 B2 | 3/2005 | Yeo et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,825,021 B2 | 11/2010 | Yamazaki et al. |
| 8,148,245 B2 | 4/2012 | Ikisawa et al. |
| 8,154,017 B2 | 4/2012 | Yabuta et al. |
| 8,304,298 B2 | 11/2012 | Ofuji et al. |
| 8,455,371 B2 | 6/2013 | Yano et al. |
| 8,502,217 B2 | 8/2013 | Sato et al. |
| 8,502,222 B2 | 8/2013 | Yabuta et al. |
| 8,785,240 B2 | 7/2014 | Watanabe |
| 8,828,811 B2 | 9/2014 | Yamazaki |
| 8,865,534 B2 | 10/2014 | Yamazaki |
| 8,945,982 B2 | 2/2015 | Yamazaki |
| 9,147,754 B2 | 9/2015 | Yamazaki |
| 9,373,707 B2 | 6/2016 | Yamazaki |
| 9,390,918 B2 | 7/2016 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0167678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0261325 A1 | 10/2009 | Kawamura et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0078633 A1 | 4/2010 | Watanabe |
| 2010/0092800 A1 | 4/2010 | Itagaki et al. |
| 2010/0102313 A1* | 4/2010 | Miyairi ............... H01L 27/1225 257/43 |
| 2010/0109002 A1 | 5/2010 | Itagaki et al. |
| 2011/0003427 A1 | 1/2011 | Sasaki et al. |
| 2011/0003428 A1 | 1/2011 | Sasaki et al. |
| 2011/0008930 A1 | 1/2011 | Sasaki et al. |
| 2011/0053322 A1 | 3/2011 | Sasaki et al. |
| 2011/0177696 A1 | 7/2011 | Yano et al. |
| 2011/0260157 A1 | 10/2011 | Yano et al. |
| 2013/0313549 A1 | 11/2013 | Yano et al. |
| 2014/0370656 A1 | 12/2014 | Yamazaki |

FOREIGN PATENT DOCUMENTS

| | | |
|---|---|---|
| CN | 101459195 A | 6/2009 |
| CN | 101681927 A | 3/2010 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |

(56) References Cited

FOREIGN PATENT DOCUMENTS

| | | |
|---|---|---|
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-132185 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-277326 A | 11/2008 |
| JP | 2008-281988 A | 11/2008 |
| JP | 2008-283046 A | 11/2008 |
| JP | 2009-099847 A | 5/2009 |
| JP | 2009-141002 A | 6/2009 |
| JP | 2010-040552 A | 2/2010 |
| TW | 201012956 | 4/2010 |
| WO | WO-2004/114391 | 12/2004 |
| WO | WO-2008/126879 | 10/2008 |
| WO | WO-2008/133220 | 11/2008 |
| WO | WO-2008/136505 | 11/2008 |
| WO | WO-2008/143021 | 11/2008 |
| WO | WO-2008/143304 | 11/2008 |
| WO | WO-2009/072532 | 6/2009 |
| WO | WO-200/084537 | 7/2009 |
| WO | WO-2009/142289 | 11/2009 |

OTHER PUBLICATIONS

Written Opinion (Application No. PCT/JP2011/061125) dated Aug. 16, 2011.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID Inernational Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(56) References Cited

OTHER PUBLICATIONS

Cho.D et al., "21.2:Al and Sn-Doped Zinc Indium Oxide Thin Film Transistors for AMOLED Backplane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 209, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka,M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Chinese Office Action (Application No. 201180024131.8) dated Feb. 3, 2015.

(56) References Cited

OTHER PUBLICATIONS

Chinese Office Action (Application No. 201610388382.9) dated Feb. 27, 2018.

* cited by examiner ured attention. The transis-
MANUFACTURING METHOD OF SEMICONDUCTOR DEVICE INCLUDING OXYGEN DOPING TREATMENT

TECHNICAL FIELD

One embodiment of the present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to the transistor. As another material, an oxide semiconductor has been attracting attention.

For example, a transistor in which an amorphous oxide containing indium (In), gallium (Ga), and zinc (Zn) and having an electron carrier concentration of lower than $10^{18}/cm^3$ is used for a semiconductor layer which is used for a channel formation region of the transistor is disclosed (see Patent Document 1).

REFERENCE

Patent Document

[Patent Document 1] Japanese Published Patent Application No. 2006-165528

DISCLOSURE OF INVENTION

However, when hydrogen or water, which forms an electron donor (donor), is mixed into the oxide semiconductor in a process for manufacturing a device, the electrical conductivity of the oxide semiconductor may change. Such a phenomenon becomes a factor of variation in the electric characteristics of a semiconductor device, such as a transistor, including the oxide semiconductor.

In view of the above problem, one object of the present invention is to provide a semiconductor device including an oxide semiconductor with stable electric characteristics.

In one embodiment of the present invention, in order to suppress variation in electric characteristics of a transistor including an oxide semiconductor film, impurities such as water, hydrogen, a hydroxyl group, or hydride (also referred to as a hydrogen compound) which cause the variation are prevented from entering the oxide semiconductor film.

One embodiment of the present invention is a semiconductor device including an oxide semiconductor film in a channel formation region of a transistor. The number of water molecules eliminated from the oxide semiconductor film is $0.5/nm^3$ or less according to thermal desorption spectroscopy.

One embodiment of the present invention is a semiconductor device including an oxide semiconductor film in a channel formation region of a transistor. The number of water molecules eliminated from the oxide semiconductor film is $0.1/nm^3$ or less according to thermal desorption spectroscopy.

One embodiment of the present invention is a method for manufacturing a semiconductor device including the step of forming an oxide semiconductor film serving as a channel formation region of a transistor by a sputtering method at a temperature higher than 200° C., so that the number of water molecules eliminated from the oxide semiconductor film is $0.5/nm^3$ or less according to thermal desorption spectroscopy. Note that the upper limit of the above temperature is preferably 500° C. or lower.

One embodiment of the present invention is a method for manufacturing a semiconductor device including the step of forming an oxide semiconductor film serving as a channel formation region of a transistor by a sputtering method at a temperature higher than 300° C., so that the number of water molecules eliminated from the oxide semiconductor film is $0.1/nm^3$ or less according to thermal desorption spectroscopy. Note that the upper limit of the above temperature is preferably 500° C. or lower.

In the above, the oxide semiconductor film preferably includes at least one of In, Ga, and Zn.

In the above, the formation atmosphere of the oxide semiconductor film is preferably a rare gas atmosphere, an oxygen atmosphere, or a mixed atmosphere of a rare gas and oxygen. Further, in the above, the transistor is preferably formed over a glass substrate.

A substrate is held in a deposition chamber kept under reduced pressure, and an oxide semiconductor film is formed while the substrate is heated at a temperature higher than 200° C. and lower than or equal to 500° C., preferably higher than 300° C. and lower than or equal to 500° C., further preferably higher than or equal to 350° C. and lower than or equal to 450° C. When the oxide semiconductor film is formed with the substrate heated, a substance including a hydrogen atom such as hydrogen, water, a hydroxyl group, or hydride which becomes a factor of variation in electric characteristics of a transistor including an oxide semiconductor can be prevented from entering the oxide semiconductor film.

In the specification, an i-type (intrinsic) oxide semiconductor refers to an oxide semiconductor which is highly purified by removing hydrogen, which is an n-type impurity to an oxide semiconductor, from the oxide semiconductor so that impurities that are not main components of the oxide semiconductor are contained as little as possible.

The electric characteristics of a transistor including a highly purified oxide semiconductor film, such as threshold voltage and on-state current, have almost no temperature dependence. Further, transistor characteristics hardly change owing to light deterioration.

According to one embodiment of the present invention, a transistor having stable electric characteristics can be provided.

In addition, according to one embodiment of the present invention, a semiconductor device which includes a highly reliable transistor having favorable electric characteristics can be provided.

BEST MODE FOR CARRYING OUT THE INVENTION

Hereinafter, embodiments and an example of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments and the example below.

Note that the ordinal numbers such as "first" and "second" in this specification are used for convenience and do not denote the order of steps or the stacking order of layers. In addition, the ordinal numbers in this specification do not denote particular names which specify the invention.

Embodiment 1

In this embodiment, one embodiment of a semiconductor device and a method for manufacturing the semiconductor device will be described with reference to FIGS. 1A to 1C, FIGS. 2A to 2D, FIGS. 3A to 3E, and FIGS. 4A to 4D.
<Example of Structure of Semiconductor Device>

Figure 1A:
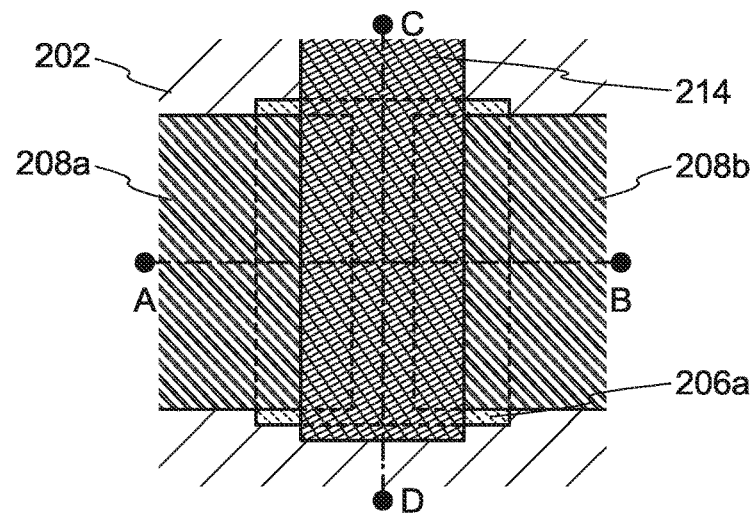
FIG. 1A is a plan view illustrating one embodiment of a semiconductor device and FIGS. 1B and 1C are cross-sectional views thereof.
Figure 1B:
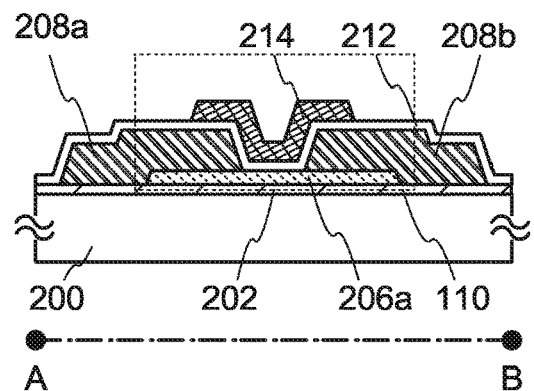
Figure 1C:
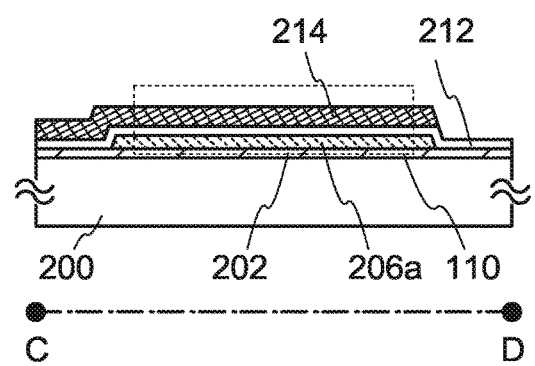

FIGS. 1A to 1C are a plan view and cross-sectional views, of a transistor 110 as an example of a semiconductor device according to one embodiment of the disclosed invention. Here, FIG. 1A is a plan view and FIGS. 1B and 1C are cross-sectional views taken along a line A-B and a line C-D, respectively, of FIG. 1A. Note that in FIG. 1A, part of components of the transistor 110 (e.g., a gate insulating film 212) are omitted for brevity.

The transistor 110 in FIGS. 1A to 1C includes, over a substrate 200, an insulating film 202, an oxide semiconductor film 206a, a source electrode 208a, a drain electrode 208b, the gate insulating film 212, and a gate electrode 214. In the transistor in FIGS. 1A to 1C, the oxide semiconductor film 206a is provided over and in contact with the insulating film 202.

The oxide semiconductor film 206a is a film from which impurities such as hydrogen, water, a hydroxyl group, or hydride (also referred to as a hydrogen compound) have been removed. For example, the oxide semiconductor film 206a is a film in which the number of water molecules eliminated is $0.5/nm^3$ or less, preferably $0.1/nm^3$ or less, according to thermal desorption spectroscopy (TDS).

When impurities which may serve as electron donors are reduced to an extremely low level in an oxide semiconductor, the oxide semiconductor can be highly purified or made to be an i-type (intrinsic) semiconductor. As described above, the oxide semiconductor film 206a which is highly purified or made to be an i-type semiconductor is used for a channel formation region of the transistor 110, so that variation in electric characteristics of the transistor 110 can be suppressed; thus, reliability of the transistor can be improved.

In the oxide semiconductor which is highly purified or made to be an i-type semiconductor, the number of carriers is extremely small (close to zero) and the carrier density is extremely low ($1\times10^{14}/cm^3$ or lower, preferably $1\times10^{12}/cm^3$ or lower). Accordingly, the amount of leakage current when the transistor is off (off-state current) can be made extremely small.

Figure 2A:
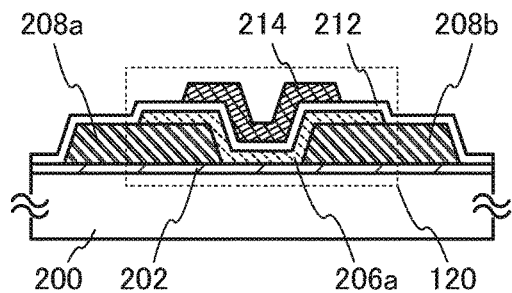
FIGS. 2A to 2D each illustrate a semiconductor device.
Figure 2B:
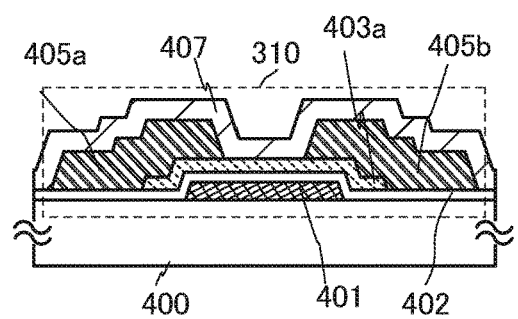
Figure 2C:
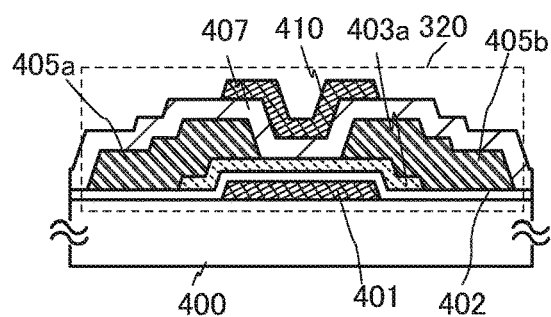
Figure 2D:
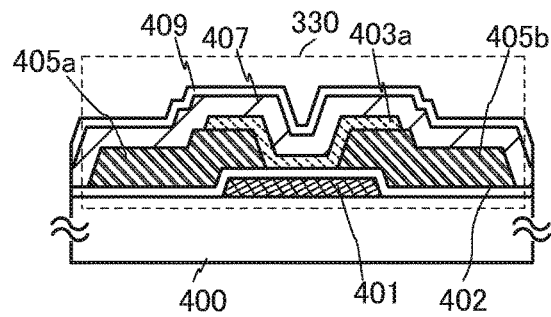

FIGS. 2A to 2D illustrate cross-sectional structures of transistors having different structures from the transistor 110. As transistors according to embodiments of the disclosed invention, a top-gate transistor is illustrated in FIG. 2A and bottom-gate transistors are illustrated in FIGS. 2B to 2D.

A transistor 120 in FIG. 2A is the same as the transistor 110 in that it includes, over the substrate 200, the insulating film 202, the oxide semiconductor film 206a, the source electrode 208a, the drain electrode 208b, the gate insulating film 212, and the gate electrode 214. The differences between the transistor 120 and the transistor 110 are the positions where the oxide semiconductor film 206a is connected to the source electrode 208a and the drain electrode 208b. In the transistor 120, the source electrode 208a and the drain electrode 208b are in contact with bottom portions of the oxide semiconductor film 206a.

A transistor 310 in FIG. 2B is a bottom-gate transistor including, over a substrate 400, a gate electrode 401, a gate insulating film 402 covering the gate electrode 401, an oxide semiconductor film 403a, a source electrode 405a, a drain electrode 405b, and an insulating film 407.

A transistor 320 in FIG. 2C is different from the transistor 310 in that a conductive film 410 is provided over the insulating film 407 and in a region overlapping with a channel formation region of the oxide semiconductor film 403a. The other components are the same as those in FIG. 2B. Note that the conductive film 410 may function as a back gate electrode. The conductive film 410 is positioned so that the channel formation region of the oxide semiconductor film 403a is positioned between the gate electrode 401 and the conductive film 410. By changing a potential of the conductive film 410, the threshold voltage of the transistor can be changed.

A transistor 330 in FIG. 2D is the same as the transistor 310 in FIG. 2B in that it includes, over the substrate 400, the gate electrode 401, the gate insulating film 402, the oxide semiconductor film 403a, the source electrode 405a, the drain electrode 405b, and the insulating film 407. The differences between the transistor 310 in FIG. 2B and the transistor 330 in FIG. 2D are the positions where the oxide semiconductor film 403a is connected to the source electrode 405a and the drain electrode 405b. The source electrode 405a and the drain electrode 405b are in contact with bottom portions of the oxide semiconductor film 403a in the transistor 330. Further, an insulating film 409 can be formed over the insulating film 407.

<Example of Manufacturing Process of Transistor>

Examples of manufacturing processes of the transistors will be described below with reference to FIGS. 3A to 3E and FIGS. 4A to 4D.

<Manufacturing Process of Transistor 110>

An example of a manufacturing process of the transistor 110 in FIGS. 1A to 1C will be described with reference to FIGS. 3A to 3E.

Figure 3A:
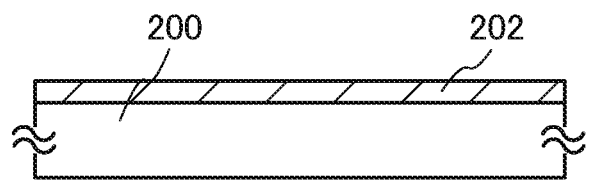
FIGS. 3A to 3E illustrate an example of a manufacturing process of a semiconductor device.

First, the insulating film 202 is formed over the substrate 200 (see FIG. 3A).

Although there is no particular limitation on the property of a material and the like of the substrate 200, it is necessary that the substrate have at least heat resistance high enough to withstand heat treatment performed later. For example, a glass substrate, a ceramic substrate, a quartz substrate, a sapphire substrate, or the like can be used as the substrate 200. Further, a single crystal semiconductor substrate or a polycrystalline semiconductor substrate of silicon, silicon carbide, or the like; a compound semiconductor substrate of silicon germanium or the like; an SOI substrate; or the like can be used. Furthermore, the substrate 200 may be any of these substrates over which a semiconductor element is provided.

Further, a flexible substrate may be used as the substrate 200. In the case of providing a transistor over a flexible substrate, the transistor may be directly formed over the flexible substrate, or any of the above substrates provided with a separation layer may be used. In the latter case, the transistor is formed over that substrate, and then the transistor may be separated at the separation layer to be transferred to another substrate such as a flexible substrate.

The insulating film 202 can be formed to have a single-layer structure or a stacked-layer structure using any of silicon oxide, silicon nitride, aluminum oxide, aluminum nitride, gallium oxide, a mixed material of any of them, and the like. The insulating film 202 can be formed by a deposition method such as a plasma CVD method or a sputtering method, for example.

The insulating film 202 is preferably formed by a method in which impurities such as hydrogen, water, a hydroxyl group, or hydride (also referred to as a substance including a hydrogen atom) do not enter the insulating film 202. When a substance including a hydrogen atom is contained in the insulating film 202, entry of the substance including a hydrogen atom into an oxide semiconductor film 206 or extraction of oxygen in the oxide semiconductor film 206 by the substance including a hydrogen atom may occur. Thus, a back channel of the oxide semiconductor film 206 might come to have low resistance (n-type conductivity) and a parasitic channel might be formed. Therefore, the insulating film 202 is preferably formed so as to contain a substance including a hydrogen atom as little as possible. For example, it is preferable to form the insulating film 202 by a sputtering method, and it is preferable that a high-purity gas from which impurities such as hydrogen, water, a hydroxyl group, or hydride have been removed be used as a sputtering gas for the deposition.

Figure 3B:
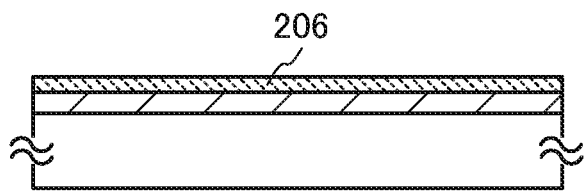

Next, the oxide semiconductor film 206 is formed over the insulating film 202 (see FIG. 3B).

As a material used for the oxide semiconductor film 206, a material including at least one element selected from In, Ga, Sn, Zn, Al, Mg, Hf and lanthanoid can be used. For example, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Pm—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; or a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or a single-component metal oxide material such as an In—O-based material, a Sn—O-based material, or a Zn—O-based material can be used. In addition, the above materials may contain $SiO_2$. Here, for example, an In—Ga—Zn—O-based material means an oxide film containing indium (In), gallium (Ga), and zinc (Zn), and there is no particular limitation on the composition ratio thereof. Further, the In—Ga—Zn—O-based material may contain an element other than In, Ga, and Zn.

The oxide semiconductor film 206 may be a thin film formed using a material represented by the chemical formula, $InMO_3(ZnO)_3$ (m>0). Here, M represents one or more metal elements selected from Ga, Al, Mn, and Co. For example, M can be Ga, Ga and Al, Ga and Mn, Ga and Co, or the like.

The thickness of the oxide semiconductor film 206 is preferably greater than or equal to 3 nm and less than or equal to 30 nm. This is because the transistor might possibly be normally on when the oxide semiconductor film 206 is too thick (e.g., the thickness is 50 nm or more).

The oxide semiconductor film 206 is preferably formed by a method in which impurities such as hydrogen, water, a hydroxyl group, or hydride do not enter the oxide semiconductor film 206. For example, a sputtering method can be used.

In this embodiment, the oxide semiconductor film 206 is formed by a sputtering method with the use of an In—Ga—Zn—O-based oxide target.

When an In—Ga—Zn—O-based material is used as an oxide semiconductor, for example, a target having a composition ratio of $In_2O_3:Ga_2O_3:ZnO=1:1:1$ [molar ratio] can be used. Note that it is not necessary to limit the material and the composition ratio of the target to the above. For example, a target having a composition ratio of $In_2O_3:Ga_2O_3:ZnO=1:1:2$ [molar ratio] can be used.

In the case where an In—Zn—O-based material is used as the oxide semiconductor, a target with the following composition ratio is used: the composition ratio of In:Zn is 50:1 to 1:2 in an atomic ratio ($In_2O_3:ZnO=25:1$ to 1:4 in a molar ratio), preferably 20:1 to 1:1 in an atomic ratio ($In_2O_3:ZnO=10:1$ to 1:2 in a molar ratio), further preferably 15:1 to 1.5:1 in an atomic ratio ($In_2O_3:ZnO=15:2$ to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The filling rate of the target is higher than or equal to 90% and lower than or equal to 100%, preferably, higher than or equal to 95% and lower than or equal to 99.9%. With the use of the target with high filling rate, the oxide semiconductor film 206 can be a dense film.

The atmosphere for deposition may be a rare gas (typically argon) atmosphere, an oxygen atmosphere, a mixed atmosphere of a rare gas and oxygen, or the like. Further, in order to prevent hydrogen, water, a hydroxyl group, hydride, or the like from entering the oxide semiconductor film, an atmosphere of a high-purity gas from which impurities such as hydrogen, water, a hydroxyl group, or hydride have been sufficiently removed is preferable.

For example, the oxide semiconductor film 206 can be formed as follows.

First, the substrate 200 is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which impurities such as hydrogen, water, a hydroxyl group, or hydride have been sufficiently removed is introduced while moisture remaining in the deposition chamber is removed, and the oxide semiconductor film 206 is formed over the substrate 200 using the above target. In order to remove moisture remaining in the deposition chamber, an entrapment vacuum pump such as a cryopump, an ion pump, or a titanium sublimation pump is preferably used as an evacuation unit. Further, an evacuation unit may be a turbo pump provided with a cold trap. In the deposition chamber which is evacuated with the cryopump, for example, impurities such as hydrogen, water, a hydroxyl group, or hydride (preferably, also a compound including a carbon atom) or the like are removed, whereby the concentration of impurities such as hydrogen, water, a hydroxyl group, or hydride in the oxide semiconductor film 206 formed in the deposition chamber can be reduced.

In the case where the substrate temperature is low (for example, 100° C. or lower) during deposition, a substance including a hydrogen atom may enter the oxide semiconductor film 206; thus, it is preferable that the substrate 200 be heated at the temperature in the above range. When the oxide semiconductor film 206 is formed with the substrate 200 heated at the above temperature, the substrate temperature is high, so that hydrogen bonds are cut by heat and are less likely to be taken into the oxide semiconductor film 206. Therefore, the oxide semiconductor film 206 is formed with the substrate 200 heated at the above temperature, whereby the concentration of impurities such as hydrogen, water, a hydroxyl group, or hydride in the oxide semiconductor film 206 can be sufficiently reduced. Moreover, damage due to sputtering can be reduced.

As a method for measuring the amount of water contained in the oxide semiconductor film 206, thermal desorption spectroscopy (TDS) can be given. For example, the temperature is raised from room temperature to about 400° C., so that elimination of water, hydrogen, a hydroxyl group, or the like in the oxide semiconductor film can be observed in a temperature range of about 200° C. to about 300° C. The oxide semiconductor film 206 obtained in the embodiment can be a film in which the number of water molecules eliminated is 0.5/nm$^3$ or less, preferably 0.1/nm$^3$ or less, according to thermal desorption spectroscopy.

An example of the deposition conditions is as follows: the distance between the substrate and the target is 60 mm, the pressure is 0.4 Pa, the direct-current (DC) power is 0.5 kW, the substrate temperature is 400° C., and the deposition atmosphere is an oxygen atmosphere (the flow rate of the oxygen is 100%). Note that a pulsed direct-current power source is preferable because powder substances (also referred to as particles or dust) generated in deposition can be reduced and the film thickness can be uniform.

Note that before the oxide semiconductor film 206 is formed by a sputtering method, powdery substances (also referred to as particles or dust) attached on a surface of the insulating film 202 are preferably removed by reverse sputtering in which an argon gas is introduced and plasma is generated. The reverse sputtering refers to a method in which voltage is applied to a substrate side and plasma is generated in the vicinity of the substrate to modify a surface of the substrate. Note that instead of argon, a gas of nitrogen, helium, oxygen or the like may be used.

Figure 3C:
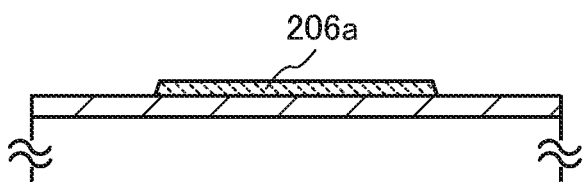

Next, the oxide semiconductor film 206 is processed, so that the oxide semiconductor film 206a having an island shape is formed (see FIG. 3C).

The oxide semiconductor film 206 can be processed by etching after a mask having a desired shape is formed over the oxide semiconductor film 206. The above mask can be formed by a method such as photolithography. Alternatively, a method such as an inkjet method may be used to form the mask. Note that the etching of the oxide semiconductor film 206 may be dry etching or wet etching. It is needless to say that these may be combined.

After that, heat treatment (first heat treatment) may be performed on the oxide semiconductor film 206a. The heat treatment removes a substance including a hydrogen atom included in the oxide semiconductor film 206a; thus, a structure of the oxide semiconductor film 206a can be improved and defect levels in energy gap can be reduced. The heat treatment is performed under an inert gas atmosphere at higher than or equal to 250° C. and lower than or equal to 700° C., preferably higher than or equal to 450° C. and lower than or equal to 600° C. or lower than the strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a way that, for example, an object to be heated is introduced into an electric furnace in which a resistance heating element or the like is used and heated, under a nitrogen atmosphere at 450° C. for an hour. The oxide semiconductor film 206a is not exposed to the air during the heat treatment so that the entry of water or hydrogen can be prevented.

The above heat treatment can be referred to as dehydration treatment, dehydrogenation treatment, or the like because of its advantageous effect of removing hydrogen, water, and the like. The heat treatment can be performed at the timing, for example, after the oxide semiconductor film is processed to have an island shape or after the gate insulating film is formed. Such dehydration treatment or dehydrogenation treatment may be performed once or plural times.

Figure 3D:
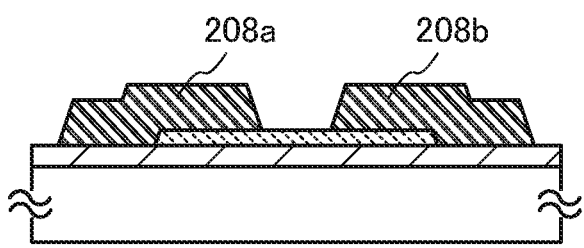

Next, a conductive film for forming the source electrode and the drain electrode (including a wiring formed in the same layer as the source electrode and the drain electrode) is formed over the insulating film 202 and the oxide semiconductor film 206a and processed to form the source electrode 208a and the drain electrode 208b (see FIG. 3D). Note that the channel length L of the transistor is determined by the distance between an end portion of the source electrode 208a and an end portion of the drain electrode 208b.

As the conductive film used for the source electrode 208a and the drain electrode 208b, for example, a metal film including an element selected from Al, Cr, Cu, Ta, Ti, Mo, and W, or a metal nitride film including any of the above elements as its component (e.g., a titanium nitride film, a molybdenum nitride film, or a tungsten nitride film) can be used. In addition, the conductive film may have a such a stacked structure that a film of high melting point metal such as Ti, Mo, or W or a metal nitride film thereof (e.g., a titanium nitride film, a molybdenum nitride film, or a tungsten nitride film) is formed over or/and below the metal film such as an Al film or a Cu film.

Alternatively, the conductive film to be the source electrode 208a and the drain electrode 208b may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon oxide is contained can be used.

The conductive film may be processed by etching using a resist mask. Ultraviolet, a KrF laser light, an ArF laser light, or the like is preferably used for light exposure for forming a resist mask for the etching.

In the case where the channel length L is less than 25 nm, the light exposure at the time of forming the resist mask is preferably performed using extreme ultraviolet light having an extremely short wavelength of several nanometers to several tens of nanometers, for example. In the light exposure by extreme ultraviolet light, the resolution is high and the focus depth is large. Thus, the channel length L of the transistor formed later can be reduced, whereby the operation speed of a circuit can be increased.

An etching step may be performed with the use of a resist mask formed using a so-called multi-tone mask. A resist mask formed using a multi-tone mask has a shape with a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

Note that in etching of the conductive film, the oxide semiconductor film 206a is partly etched, so that the oxide semiconductor film 206a having a groove (a recessed portion) is formed in some cases.

After that, plasma treatment using a gas such as $N_2O$, $N_2$, or Ar may be performed so that water or the like adsorbed onto a surface of an exposed portion of the oxide semiconductor film 206a is removed.

Then, the gate insulating film 212 is formed so as to cover the source electrode 208a and the drain electrode 208b and to be in contact with part of the oxide semiconductor film 206a. After that, a conductive film for forming the gate electrode (including a wiring formed in the same layer as the gate electrode) is formed and processed to form the gate electrode 214 (see FIG. 3E).

The gate insulating film 212 can be formed to have a single-layer structure or a stacked-layer structure using any of silicon oxide, silicon nitride, aluminum oxide, aluminum nitride, gallium oxide, a mixed material of any of them, and the like. Alternatively, an oxide of gallium (for example, gallium oxide) to which silicon oxide is added to 0 atomic % to 20 atomic % can be used for the gate insulating film 212. Further alternatively, a material having a high dielectric constant, such as hafnium oxide, may be used for the gate insulating film 212 considering the function of the gate insulating film of the transistor. Here, dehydration treatment or dehydrogenation treatment may be performed after the gate insulating film 212 is formed.

Note that oxygen doping treatment may be performed after formation of the oxide semiconductor film 206, after formation of the oxide semiconductor film 206a, or after formation of the gate insulating film 212. The "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk.

By the oxygen doping treatment, variation in a threshold voltage Vth caused by oxygen deficiency in the oxide semiconductor film can be reduced and the amount of shift of the threshold voltage ($\Delta$Vth) can be reduced.

The oxygen doping treatment is preferably performed by using oxygen plasma which is excited by an inductively coupled plasma (ICP) method.

The gate electrode 214 can be formed using a metal material such as molybdenum, titanium, tantalum, tungsten, aluminum, copper, neodymium, or scandium, or an alloy material which includes any of these materials as a main component. Note that the gate electrode 214 may have a single-layer structure or a stacked-layer structure.

Figure 3E:
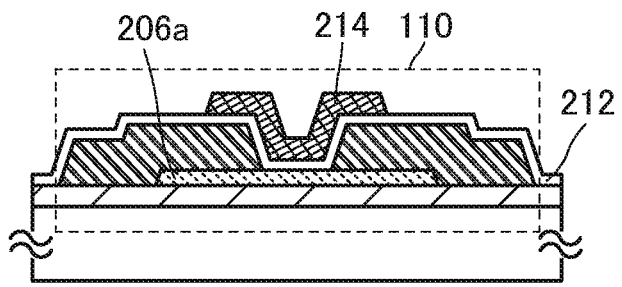

Through the above-described process, the transistor 110 can be formed (see FIG. 3E).

<Manufacturing Process of Transistor 120>

Next, an example of a manufacturing process of the transistor 120 illustrated in FIG. 2A will be described.

First, the insulating film 202 is formed over the substrate 200. For details of the substrate 200 and the insulating film 202, the description of the manufacturing process of the transistor 110 can be referred to.

Next, a conductive film for forming the source electrode and the drain electrode (including a wiring formed in the same layer as the source electrode and the drain electrode) is formed over the insulating film 202 and processed to form the source electrode 208a and the drain electrode 208b. For details of the source electrode 208a and the drain electrode 208b, the description of the manufacturing process of the transistor 110 can be referred to.

Next, an oxide semiconductor film connected to the source electrode 208a and the drain electrode 208b is formed over the insulating film 202. Then, the oxide semiconductor film is processed to be the island-shaped oxide semiconductor film 206a. For details of the oxide semiconductor film 206a, the description of the manufacturing process of the transistor 110 can be referred to.

Next, the gate insulating film 212 is formed so as to cover the source electrode 208a and the drain electrode 208b and to be in contact with part of the oxide semiconductor film 206a. Then, the gate electrode 214 is formed. The description of the manufacturing process of the transistor 110 can be referred to for details of the gate insulating film 212 and the gate electrode 214.

Note that dehydration treatment or dehydrogenation treatment is preferably performed on the oxide semiconductor film in any of the steps after the oxide semiconductor film is formed, in the manufacturing process of the transistor 120.

Through the above-described process, the transistor 120 can be formed (see FIG. 2A).

<Manufacturing Process of Transistors 310 and 320>

Next, an example of manufacturing processes of the transistor 310 in FIG. 2B and the transistor 320 in FIG. 2C will be described with reference to FIGS. 4A to 4D.

First, a conductive film for forming the gate electrode (including a wiring formed in the same layer as the gate electrode) is formed over the substrate 400 and processed, so that the gate electrode 401 is formed. Then, the gate insulating film 402 is formed so as to cover the gate electrode 401 (see FIG. 4A). For details of the substrate 400 and the gate electrode 401, the descriptions of the substrate 200 and the gate electrode 214 can be referred to, respectively.

For details of the gate insulating film 402, the description of the gate insulating film 212 can be referred to.

Figure 4A:
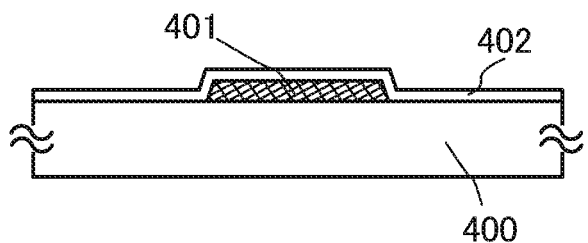
FIGS. 4A to 4D illustrate an example of a manufacturing process of a semiconductor device.
Figure 4B:
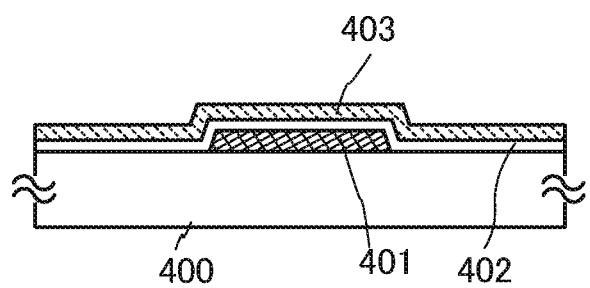

Next, an oxide semiconductor film 403 is formed over the gate insulating film 402 (see FIG. 4B). For details of the oxide semiconductor film 403, the description of the oxide semiconductor film 206 can be referred to.

Figure 4C:
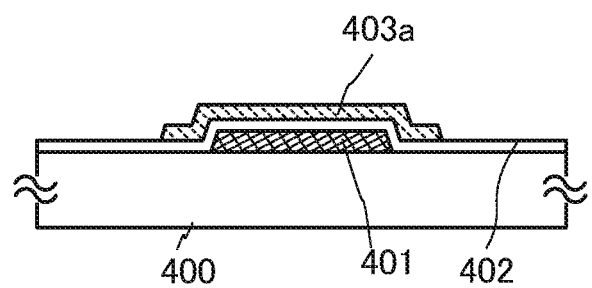

Then, the oxide semiconductor film 403 is processed, so that the oxide semiconductor film 403a having an island shape is formed (see FIG. 4C). For details of a processing method of the oxide semiconductor film 403, the description of the processing method of the oxide semiconductor film 206 can be referred to.

Next, a conductive film for forming the source electrode and the drain electrode (including a wiring formed in the same layer as the source electrode and the drain electrode) is formed over the gate insulating film 402 and the oxide semiconductor film 403a and processed to form the source electrode 405a and the drain electrode 405b. After that, the insulating film 407 is formed so as to cover the oxide semiconductor film 403a, the source electrode 405a, and the drain electrode 405b (see FIG. 4D). For details of the source electrode 405a and the drain electrode 405b, the description of the source electrode 208a and the drain electrode 208b can be referred to. For details of the insulating film 407, the description of the insulating film 202 can be referred to.

Figure 4D:
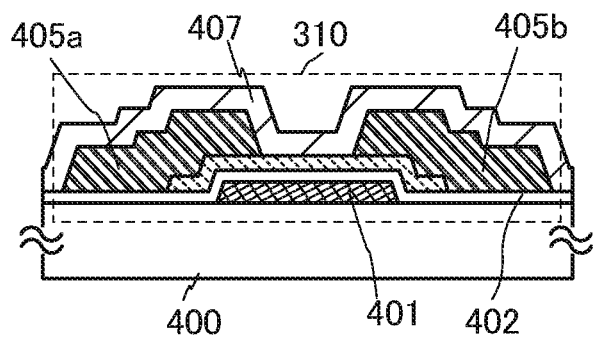

Through the above process, the transistor 310 is formed (see FIG. 4D).

Further, the conductive film 410 is formed over the insulating film 407 in FIG. 4D. In this manner, the transistor 320 illustrated in FIG. 2C can be formed. For details of the conductive film 410, the description of the gate electrode 401 can be referred to. Note that the conductive film 410 functions as a back gate electrode. By changing a potential of the back gate electrode, the threshold voltage of the transistor can be changed.

Note that dehydration treatment or dehydrogenation treatment is preferably performed on the oxide semiconductor film in any of the steps after the oxide semiconductor film is formed, in the manufacturing process of the transistor 310 and the transistor 320.

<Manufacturing Process of Transistor 330>

Next, an example of a manufacturing process of the transistor 330 illustrated in FIG. 2D will be described.

First, a conductive film for forming the gate electrode (including a wiring formed in the same layer as the gate electrode) is formed over the substrate 400 and processed, so that the gate electrode 401 is formed. Then, the gate insulating film 402 is formed so as to cover the gate electrode 401. For details of the substrate 400, the gate electrode 401 and the gate insulating film 402, the descriptions of the substrate 200, the gate electrode 214 and the gate insulating film 212 can be referred to, respectively.

Next, a conductive film for forming the source electrode and the drain electrode (including a wiring formed in the same layer as the source electrode and the drain electrode) is formed over the gate insulating film 402 and processed to form the source electrode 405a and the drain electrode 405b. For details of the source electrode 405a and the drain electrode 405b, the description of the source electrode 208a and the drain electrode 208b can be referred to.

Next, an oxide semiconductor film is formed over the gate insulating film 402, the source electrode 405a, and the drain electrode 405b and the oxide semiconductor film is processed, so that the island-shaped oxide semiconductor film 403a is formed. For details of the oxide semiconductor film 403a, the description of the oxide semiconductor film 206a can be referred to.

Then, the insulating film 407 is formed so as to cover the oxide semiconductor film 403a, the source electrode 405a, and the drain electrode 405b. After that, the insulating film 409 is formed over the insulating film 407. For details of the insulating film 407 and the insulating film 409, the description of the insulating film 202 can be referred to. For example, the insulating film 407 can be formed using a gallium oxide film and the insulating film 409 can be formed using a silicon oxide film.

Through the above process, the transistor 330 is formed (see FIG. 2D).

Note that dehydration treatment or dehydrogenation treatment is preferably performed on the oxide semiconductor film in any of the steps after the oxide semiconductor film is formed, in the manufacturing process of the transistor 330.

As described above, in the transistor according to this embodiment, the substrate is heated at a temperature higher than 200° C. and lower than or equal to 500° C., preferably higher than 300° C. and lower than or equal to 500° C., further preferably higher than or equal to 350° C. and lower than or equal to 450° C. at the time of forming the oxide semiconductor film. By formation of the oxide semiconductor film at such a temperature, impurities such as hydrogen, water, a hydroxyl group, or hydride can be prevented from entering the oxide semiconductor film.

Impurities which may serve as electron donors are reduced to an extremely low level in the oxide semiconductor, whereby the oxide semiconductor can be highly purified or made to be an i-type (intrinsic) semiconductor. By using the oxide semiconductor film which is highly purified or made to be an i-type semiconductor for a channel formation region of the transistor, variation in electric characteristics of the transistor can be suppressed, so that reliability of the transistor can be improved.

In the oxide semiconductor which is highly purified or made to be an i-type semiconductor, the number of carriers is extremely small (close to zero) and the carrier density is extremely low ($1\times10^{14}$/cm$^3$ or lower, preferably $1\times10^{12}$/cm$^3$ or lower). Accordingly, the amount of leakage current when the transistor is off (off-state current) can be made extremely small.

As described above, a semiconductor device including an oxide semiconductor with stable electric characteristics can be provided. Therefore, a semiconductor device with high reliability can be provided.

The structures, methods, and the like described in this embodiment can be combined as appropriate with any of the structures, methods, and the like described in the other embodiments.

Embodiment 2

A semiconductor device having a display function (also referred to as a display device) can be manufactured using the transistor an example of which is described in Embodiment 1. Moreover, some or all of driver circuits which include the transistor can be formed over a substrate where a pixel portion is formed, whereby a system-on-panel can be obtained.

Figure 5A:
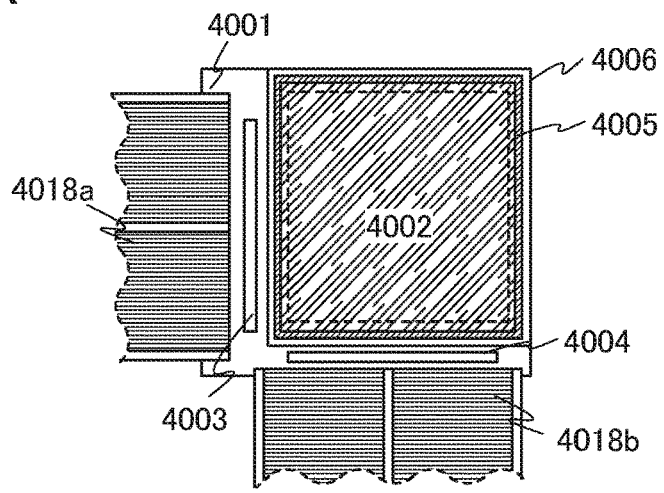
FIGS. 5A to 5C each illustrate one embodiment of a semiconductor device.

In FIG. 5A, a sealant 4005 is provided so as to surround a pixel portion 4002 provided over a first substrate 4001, and the pixel portion 4002 is sealed between the first substrate 4001 and a second substrate 4006. In FIG. 5A, a signal line driver circuit 4003 and a scan line driver circuit 4004 which are formed using a single crystal semiconductor film or a polycrystalline semiconductor film over a substrate separately prepared are mounted in a region that is different from the region surrounded by the sealant 4005 over the first substrate 4001. Various signals and potentials are supplied to the signal line driver circuit 4003 and the scan line driver circuit 4004 each of which is separately formed, and the pixel portion 4002, from flexible printed circuits (FPCs) 4018*a* and 4018*b*.

Figure 5B:
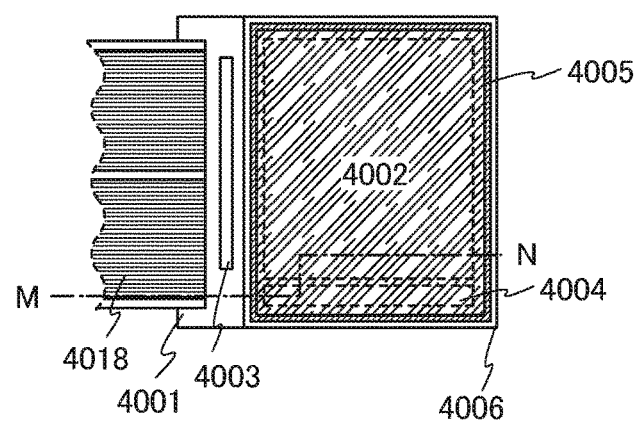
Figure 5C:
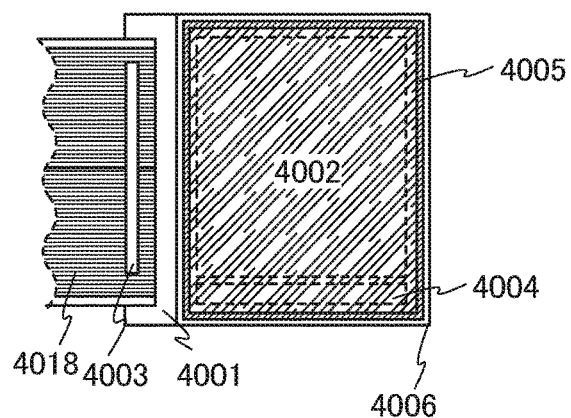

In FIGS. 5B and 5C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a display element, by the first substrate 4001, the sealant 4005, and the second substrate 4006. In FIGS. 5B and 5C, the signal line driver circuit 4003 which is formed using a single crystal semiconductor film or a polycrystalline semiconductor film over a substrate separately prepared is mounted in a region that is different from the region surrounded by the sealant 4005 over the first substrate 4001. In FIGS. 5B and 5C, various signals and potentials are supplied to the signal line driver circuit 4003 which is separately formed, the scan line driver circuit 4004, and the pixel portion 4002, from an FPC 4018.

Although FIGS. 5B and 5C each illustrate the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method or the like can be used. FIG. 5A illustrates an example in which the signal line driver circuit 4003 and the scan line driver circuit 4004 are mounted by a COG method. FIG. 5B illustrates an example in which the signal line driver circuit 4003 is mounted by a COG method. FIG. 5C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit which are provided over the first substrate include a plurality of transistors, to which any of the transistors described in Embodiment 1 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 6:
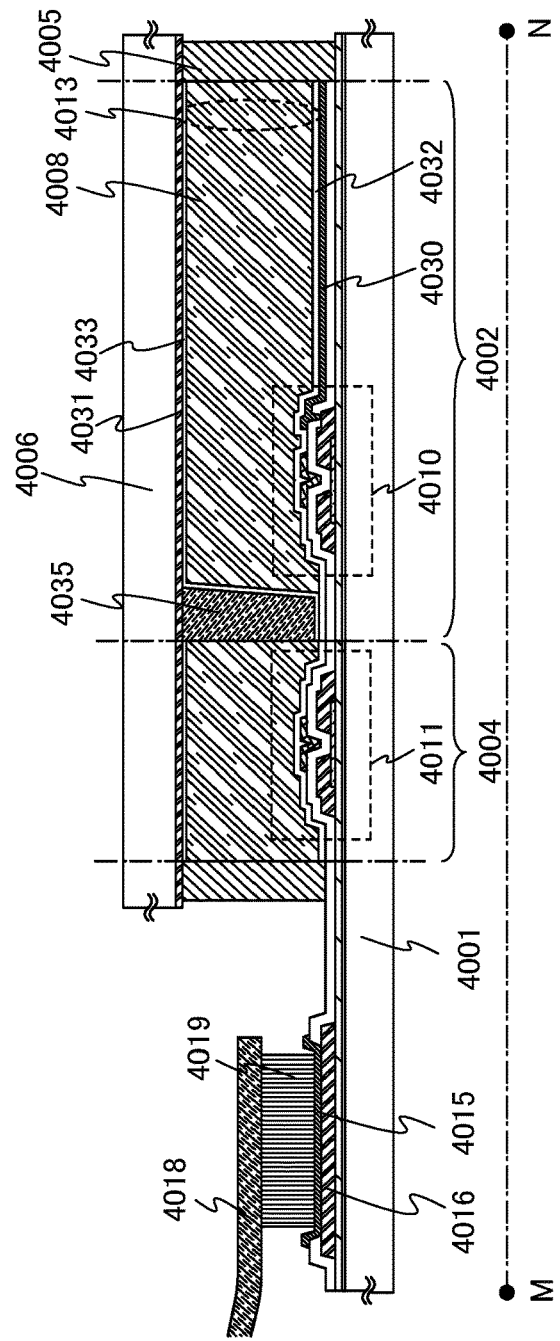
FIG. 6 illustrates one embodiment of a semiconductor device.
Figure 7:
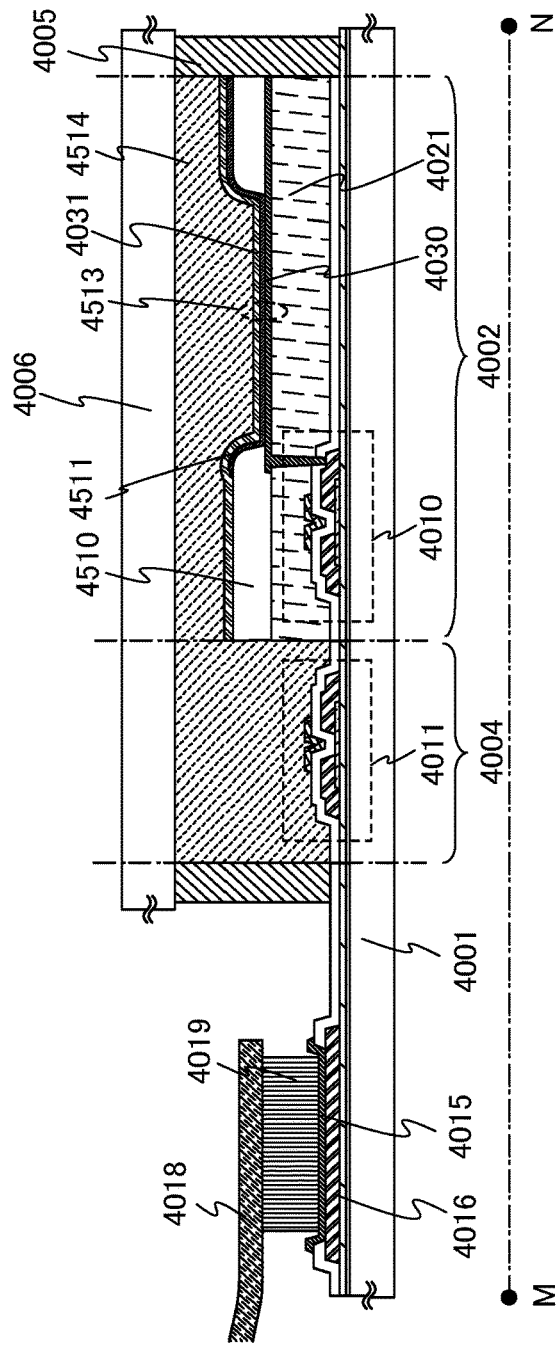
FIG. 7 illustrates one embodiment of a semiconductor device.
Figure 8:
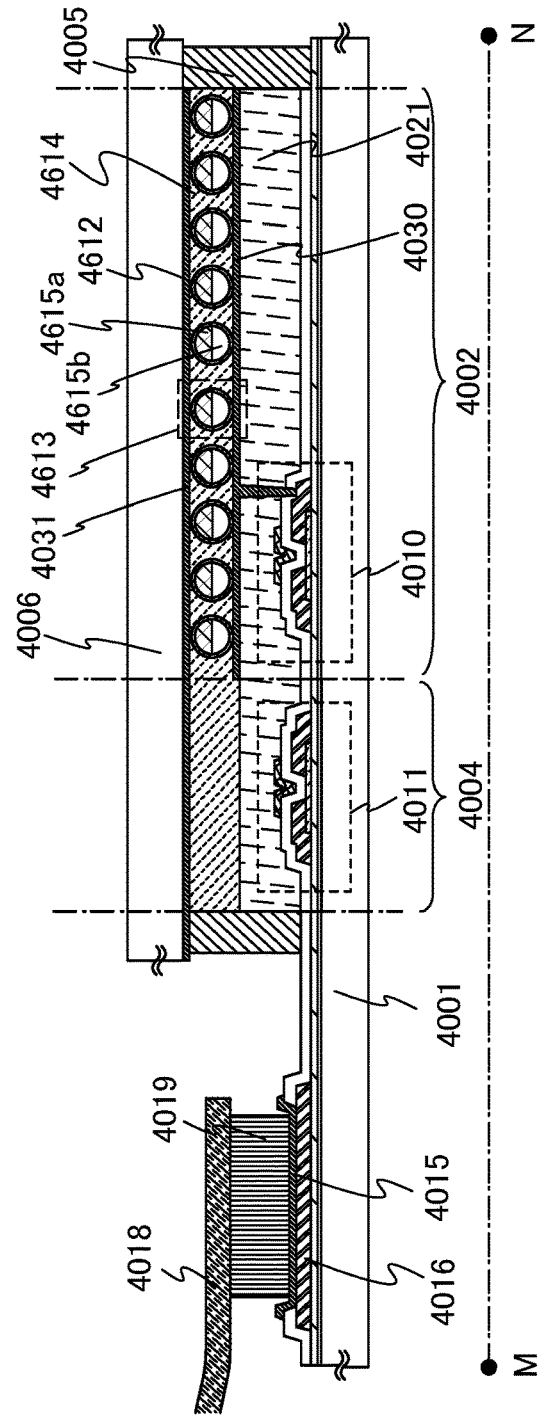
FIG. 8 illustrates one embodiment of a semiconductor device.

One embodiment of the semiconductor device is described with reference to FIG. 6, FIG. 7, and FIG. 8. FIG. 6, FIG. 7, and FIG. 8 correspond to cross-sectional views along line M-N in FIG. 5B.

As illustrated in FIG. 6, FIG. 7, and FIG. 8, the semiconductor device includes a connection terminal electrode 4015 and a terminal electrode 4016, and the connection terminal electrode 4015 and the terminal electrode 4016 are electrically connected to a terminal included in the FPC 4018 through an anisotropic conductive film 4019.

The connection terminal electrode 4015 is formed using the same conductive film as a first electrode layer 4030, and the terminal electrode 4016 is formed using the same conductive film as source and drain electrodes of transistors 4010 and 4011.

The pixel portion 4002 and the scan line driver circuit 4004 which are provided over the first substrate 4001 include a plurality of transistors. In FIG. 6, FIG. 7, and FIG. 8, the transistor 4010 included in the pixel portion 4002 and the transistor 4011 included in the scan line driver circuit 4004 are illustrated as an example.

In this embodiment, any of the transistors described in Embodiment 1 can be applied to the transistors 4010 and 4011. Consequently, variation in the electric characteristics of the transistors 4010 and 4011 is suppressed and the transistors 4010 and 4011 are electrically stable. Accordingly, highly reliable semiconductor devices can be provided as the semiconductor devices illustrated in FIG. 6, FIG. 7, and FIG. 8.

The transistor 4010 included in the pixel portion 4002 is electrically connected to a display element to form a display panel. A variety of display elements can be used as the display element as long as display can be performed.

An example of a liquid crystal display device using a liquid crystal element as the display element is described in FIG. 6. In FIG. 6, a liquid crystal element 4013 which is a display element includes the first electrode layer 4030, a second electrode layer 4031, and a liquid crystal layer 4008. Insulating films 4032 and 4033 serving as alignment films are provided so that the liquid crystal layer 4008 is interposed therebetween. The second electrode layer 4031 is provided on the second substrate 4006 side, and the first electrode layer 4030 and the second electrode layer 4031 are stacked, with the liquid crystal layer 4008 interposed therebetween. Note that in the display device illustrated in FIG. 5B, a cross section taken along line M-N in the case where a liquid crystal element is used as the display element corresponds to FIG. 6.

A columnar spacer denoted by reference numeral 4035 is obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal exhibiting a blue phase and a chiral material has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is $1 \times 10^9$ Ω·cm or more, preferably $1 \times 10^{11}$ Ω·cm or more, further preferably $1 \times 10^{12}$ Ω·cm or more. The value of the specific resistivity in this specification is measured at 20° C.

The size of a storage capacitor formed in the liquid crystal display device is set considering the leakage current of the transistor provided in the pixel portion or the like so that charge can be held for a predetermined period. By using the transistor including the highly purified oxide semiconductor film, it is enough to provide a storage capacitor having a capacitance that is ⅓ or less, preferably ⅕ or less of a liquid crystal capacitance of each pixel.

In the transistor used in this embodiment, which includes the highly purified oxide semiconductor film, the current value in an off state (the off-state current value) can be made small. Accordingly, an electrical signal such as an image signal can be held for a longer period, and a writing interval can be set longer when the power is on. Accordingly, frequency of refresh operation can be reduced, which leads to an effect of suppressing power consumption.

The transistor including the highly purified oxide semiconductor film used in this embodiment can have relatively high field-effect mobility and thus can operate at high speed. Therefore, by using the transistor in the pixel portion of the liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode may be used. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode; for example, a multi-domain vertical alignment (MVA) mode, a patterned vertical alignment (PVA) mode, an ASV mode, or the like can be employed. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

It is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different among respective dots of color elements. The present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. A transistor and a light-emitting element are formed over a substrate. The light-emitting element can have a top emission structure in which light emission is extracted through the surface on the side opposite to the substrate; a bottom emission structure in which light emission is extracted through the surface on the substrate side; or a dual emission structure in which light emission is extracted through the surface on the side opposite to the substrate and the surface on the substrate side. A light-emitting element having any of these emission structures can be used.

An example of a light-emitting device in which a light-emitting element is used as the display element is illustrated in FIG. 7. A light-emitting element 4513 which is a display element is electrically connected to the transistor 4010 provided in the pixel portion 4002. A structure of the light-emitting element 4513 is not limited to the stacked-layer structure including the first electrode layer 4030, an electroluminescent layer 4511, and the second electrode layer 4031, which is illustrated in FIG. 7. The structure of the light-emitting element 4513 can be changed as appropriate depending on a direction in which light is extracted from the light-emitting element 4513, or the like. Note that in the display device illustrated in FIG. 5B, a cross section taken along line M-N in the case where a light-emitting element is used as the display element corresponds to FIG. 7.

A partition wall 4510 can be formed using an organic insulating material or an inorganic insulating material. It is particularly preferable that the partition wall 4510 be formed using a photosensitive resin material to have an opening over the first electrode layer 4030 so that a sidewall of the opening has a tilted surface with continuous curvature.

The electroluminescent layer 4511 may be formed using a single layer or a plurality of layers stacked.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In addition, in a space which is formed with the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover material with high air-tightness and little degasification so as not to be exposed to the outside air, in this manner.

As the filler 4514, an ultraviolet curable resin or a thermosetting resin can be used as well as an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

Further, an electronic paper in which electronic ink is driven can be provided as the display device. The electronic paper is also referred to as an electrophoretic display device (an electrophoretic display) and is advantageous in that it has the same level of readability as regular paper, it has lower power consumption than other display devices, and it can be made thin and lightweight.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display method can be used. The twisting ball display method refers to a method in which spherical particles each colored in black and white are arranged between a first electrode layer and a second electrode layer which are electrode layers used for a display element, and a potential difference is generated between the first electrode layer and the second electrode layer to control the orientation of the spherical particles, so that display is performed.

FIG. 8 illustrates active matrix electronic paper as one embodiment of a semiconductor device. The electronic paper in FIG. 8 is an example of a display device using a twisting ball display method.

Between the first electrode layer 4030 connected to the transistor 4010 and the second electrode layer 4031 provided on the second substrate 4006, spherical particles 4613 each of which includes a black region 4615a, a white region 4615b, and a cavity 4612 which is filled with liquid around the black region 4615a and the white region 4615b, are provided. A space around the spherical particles 4613 is filled with a filler 4614 such as a resin. The second electrode layer 4031 corresponds to a common electrode (counter electrode). The second electrode layer 4031 is electrically connected to a common potential line.

In FIG. 6, FIG. 7, and FIG. 8, a flexible substrate as well as a glass substrate can be used as any of the first substrate 4001 and the second substrate 4006. For example, a plastic substrate having light-transmitting properties can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

An insulating layer 4021 can be formed using an inorganic insulating material or an organic insulating material. Note that the insulating layer 4021 formed using a heat-resistant organic insulating material such as an acrylic resin, polyimide, a benzocyclobutene resin, polyamide, or an epoxy resin is preferably used as a planarizing insulating film. Other than such organic insulating materials, it is possible to use a low-dielectric constant material (a low-k material), a siloxane based resin, phosphosilicate glass (PSG), borophosphosilicate glass (BPSG), or the like. The insulating layer may be formed by stacking a plurality of insulating films formed of these materials.

There is no particular limitation on the method for forming the insulating layer 4021, and the insulating layer 4021 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device displays an image by transmitting light from a light source or a display element. Therefore, the substrate and the thin films such as the insulating film and the conductive film provided for the pixel portion where light is transmitted have light-transmitting properties with respect to light in the visible-light wavelength range.

The first electrode layer and the second electrode layer (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The first electrode layer 4030 and the second electrode layer 4031 can be formed of one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof, and the like can be given.

Since the transistor is easily broken owing to static electricity or the like, a protective circuit for protecting the driver circuit is preferably provided. The protective circuit is preferably formed using a nonlinear element.

As described above, by using any of the transistors described in Embodiment 1, a semiconductor device having higher reliability can be provided. Note that the transistors described in Embodiment 1 can be applied to semiconductor devices having a variety of functions such as a power device mounted on a power supply circuit, a semiconductor integrated circuit such as an LSI, and a semiconductor device having an image sensor function of reading information of an object, in addition to the above semiconductor device having a display function.

The structures, methods, and the like described in this embodiment can be combined as appropriate with any of the structures, methods, and the like described in the other embodiments.

Embodiment 3

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 9A:
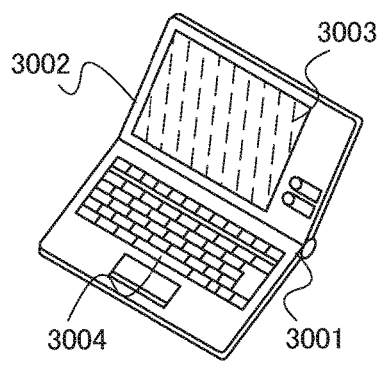
FIGS. 9A to 9F each illustrate an electronic device.

FIG. 9A is a laptop personal computer, which includes a main body 3001, a housing 3002, a display portion 3003, a keyboard 3004, and the like. The semiconductor device described in Embodiment 1 or 2 is applied, whereby a highly reliable laptop personal computer can be provided.

Figure 9B:
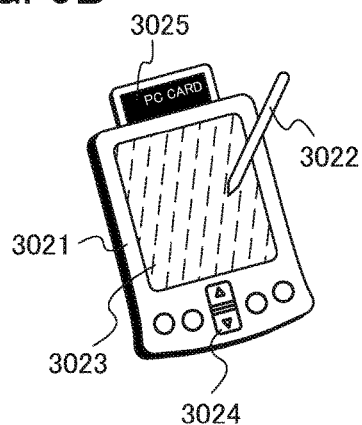

FIG. 9B is a portable information terminal (PDA), which includes a display portion 3023, an external interface 3025, an operation button 3024, and the like in a main body 3021. A stylus 3022 is included as an accessory for operation. The semiconductor device described in Embodiment 1 or 2 is applied, whereby a highly reliable portable information terminal (PDA) can be provided.

Figure 9C:
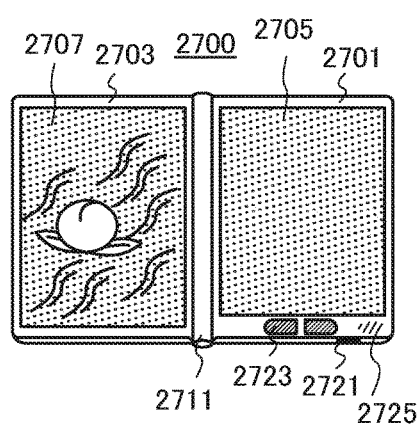

FIG. 9C illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 9C) can display text and a display portion on the left side (the display portion 2707 in FIG. 9C) can display graphics.

The semiconductor device described in Embodiment 1 or 2 is applied, whereby the electronic book reader 2700 can have high reliability.

Further, FIG. 9C illustrates an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Figure 9D:
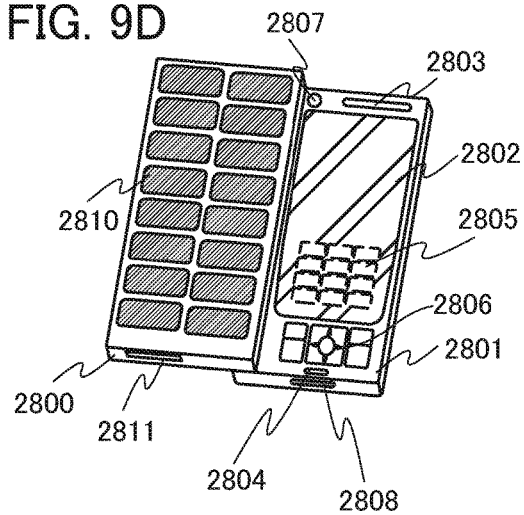

FIG. 9D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801. The semiconductor device described in Embodiment 1 or 2 is applied, whereby a highly reliable mobile phone can be provided.

Further, the display panel 2802 is provided with a touch panel. A plurality of operation keys 2805 that is displayed as images is illustrated by dashed lines in FIG. 9D. Note that a boosting circuit by which a voltage output from the solar cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can be slid so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer or the like are possible. A large amount of data can be stored by inserting a storage medium into the external memory slot 2811 and can be moved.

Further, in addition to the above functions, an infrared communication function, a television reception function, or the like may be provided.

Figure 9E:
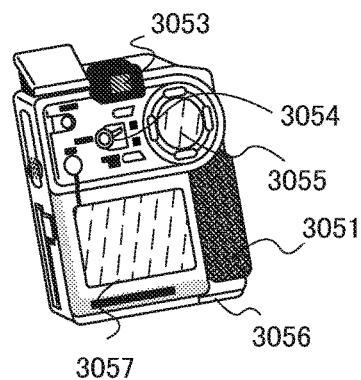

FIG. 9E is a digital video camera including a main body 3051, a display portion A 3057, an eye piece 3053, an operation switch 3054, a display portion B 3055, a battery 3056, and the like. The semiconductor device described in Embodiment 1 or 2 is applied, whereby a highly reliable digital video camera can be provided.

Figure 9F:
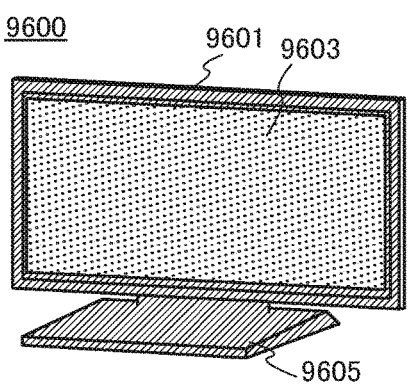

FIG. 9F illustrates an example of a television set. In a television set 9600, a display portion 9603 is incorporated in a housing 9601. The display portion 9603 can display images. Here, the housing 9601 is supported by a stand 9605. The semiconductor device described in Embodiment 1 or 2 is applied, whereby the television set 9600 can have high reliability.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The structures, methods, and the like described in this embodiment can be combined as appropriate with any of the structures, methods, and the like described in the other embodiments.

EXAMPLE

In this example, results will be described of a research with thermal desorption spectroscopy on elimination of a substance including a hydrogen atom which is contained in an oxide semiconductor.

In thermal desorption spectroscopy, infrared heating is performed on a sample in high vacuum and released gas molecules are subjected to mass spectrometry, whereby a mass spectrum of a component eliminated from the sample is obtained at each temperature. The degree of vacuum of a background of a measurement apparatus is $1.33 \times 10^{-7}$ Pa ($10^{-9}$ Torr), which enables a component whose amount is extremely small to be analyzed. In this example, EMD-WA1000S manufactured by ESCO Ltd. was used.

In this example, an oxide semiconductor film (In—Ga—Zn—O-based non-single-crystal film) was formed over a glass substrate to a thickness of 50 nm. As deposition conditions of the oxide semiconductor film, the substrate temperature was set to the three conditions: room temperature, 200° C., and 400° C. The deposition atmosphere was a mixed atmosphere of argon and oxygen (the flow rate of oxygen: 33%).

Figure 10A:
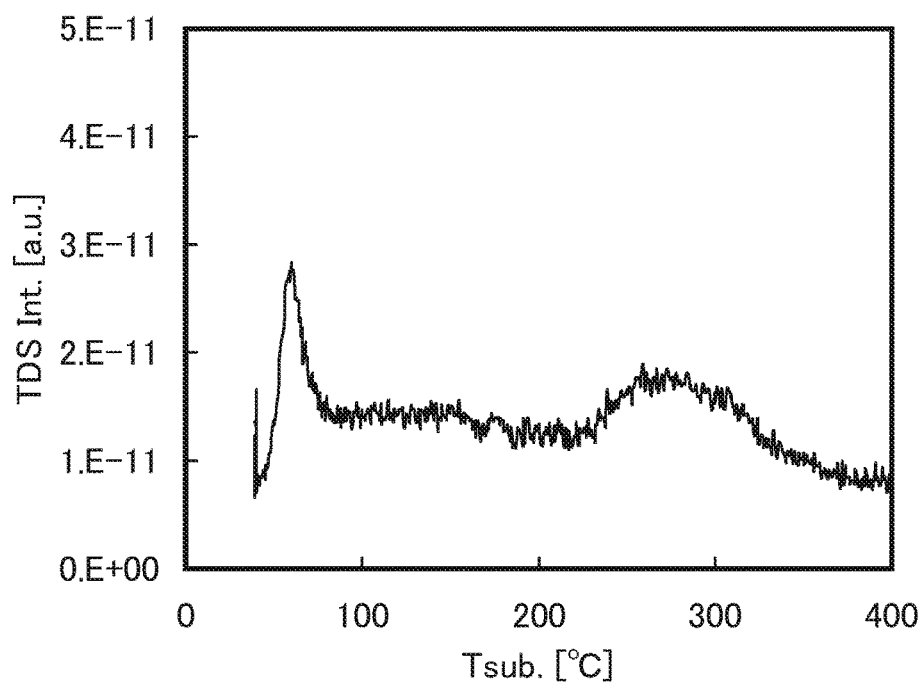
FIGS. 10A and 10B show results of thermal desorption spectroscopy performed on an oxide semiconductor film.
Figure 10B:
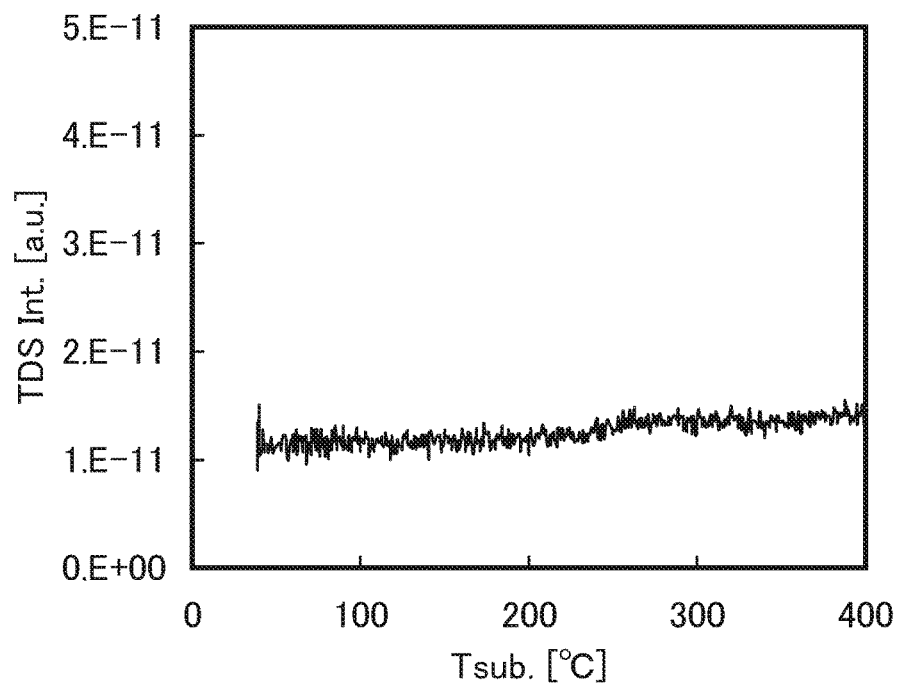
Figure 11A:
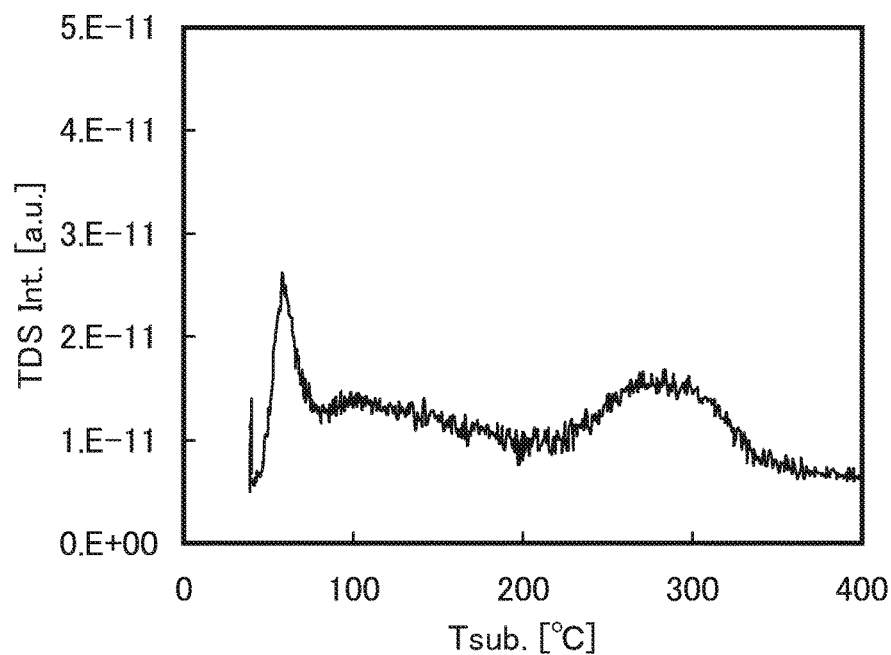
FIGS. 11A and 11B show results of thermal desorption spectroscopy performed on an oxide semiconductor film.
Figure 11B:
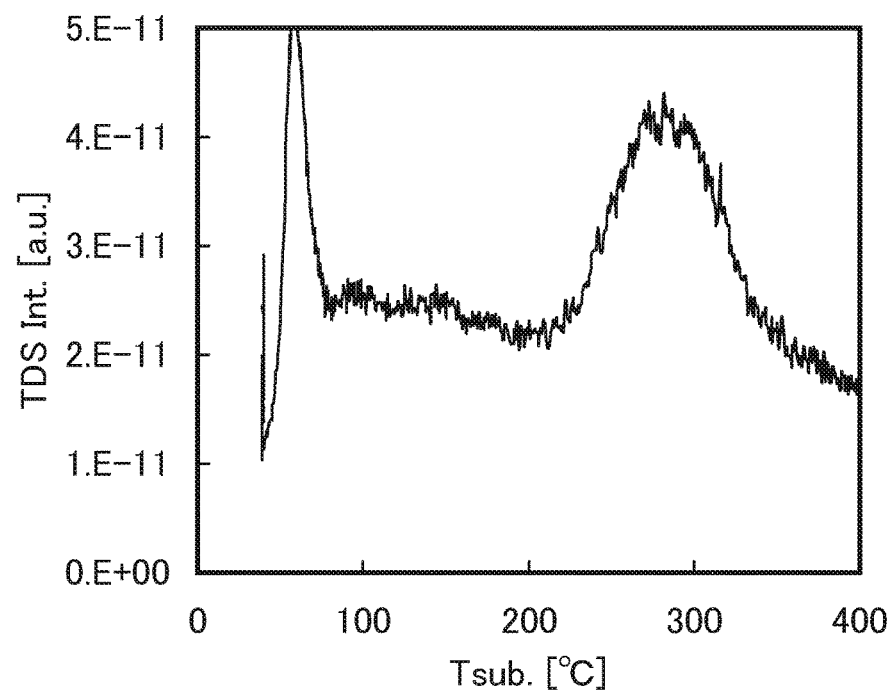

FIGS. 10A and 10B and FIGS. 11A and 11B show results in the case where the oxide semiconductor film was formed at room temperature. FIG. 10A shows the intensity of a substance (H) whose mass number is 1, FIG. 10B shows the intensity of a substance ($H_2$) whose mass number is 2, FIG. 11A shows the intensity of a substance (OH) whose mass number is 17, and FIG. 11B shows the intensity of a substance ($H_2O$) whose mass number is 18.

Figure 12A:
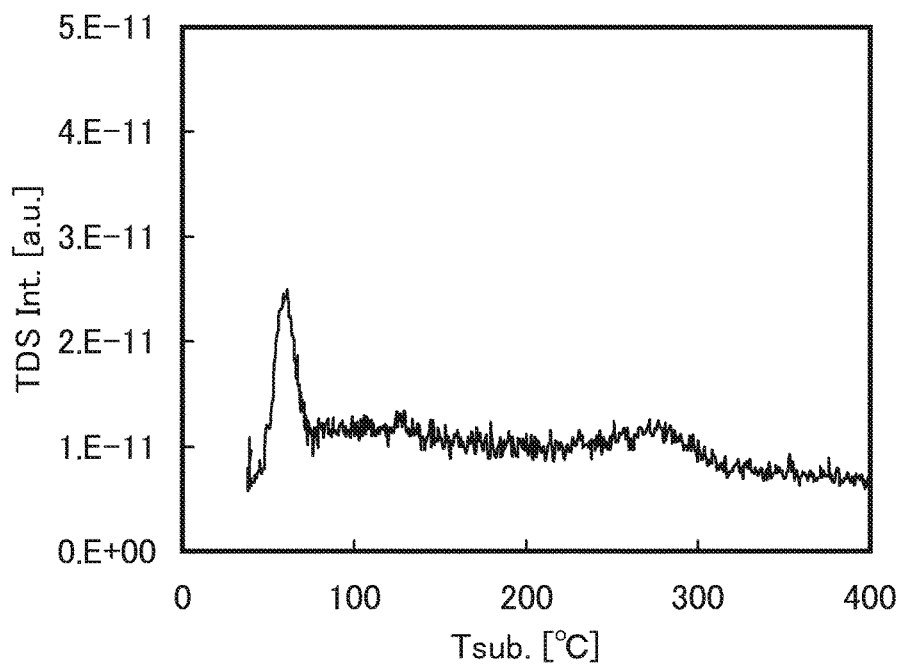
FIGS. 12A and 12B show results of thermal desorption spectroscopy performed on an oxide semiconductor film.
Figure 12B:
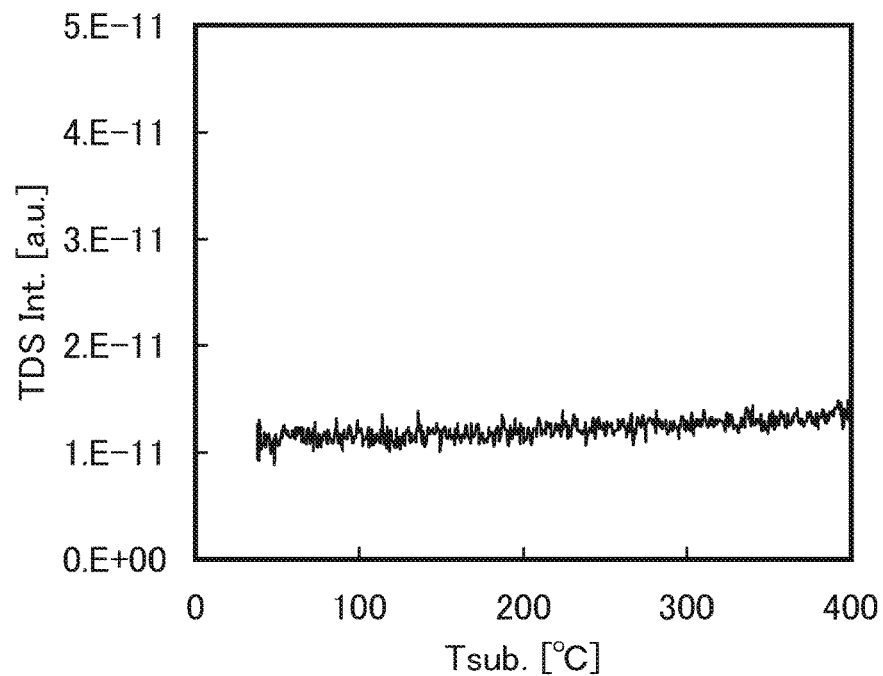
Figure 13A:
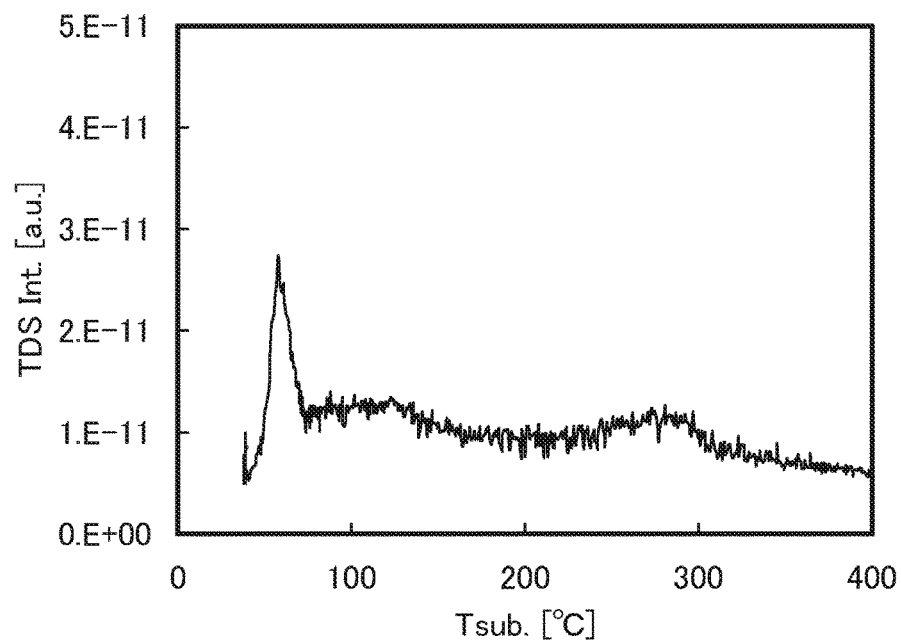
FIGS. 13A and 13B show results of thermal desorption spectroscopy performed on an oxide semiconductor film.
Figure 13B:
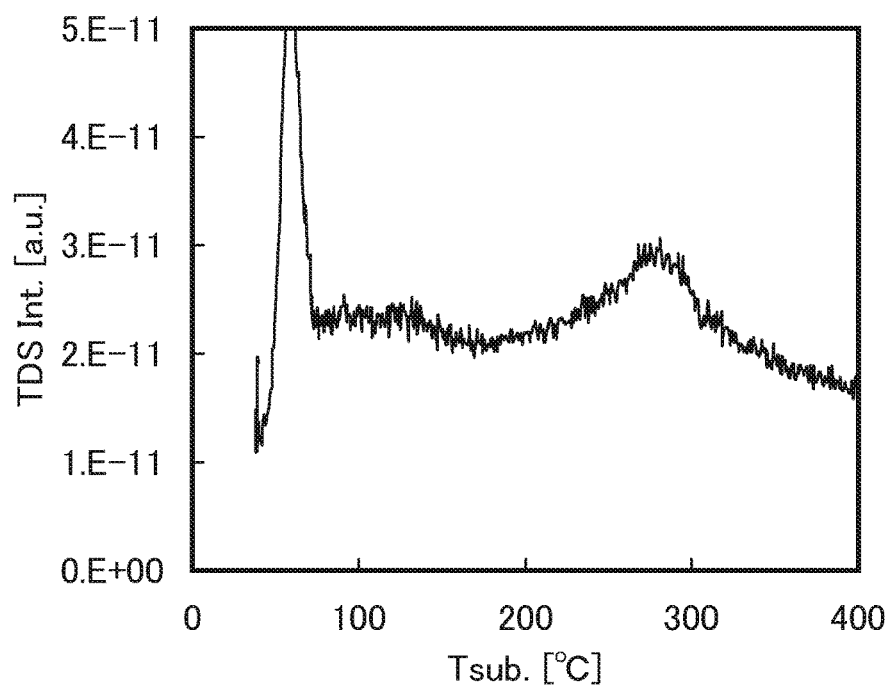

FIGS. 12A and 12B and FIGS. 13A and 13B show results in the case where the oxide semiconductor film was formed at 200° C. FIG. 12A shows the intensity of a substance (H) whose mass number is 1, FIG. 12B shows the intensity of a substance ($H_2$) whose mass number is 2, FIG. 13A shows the intensity of a substance (OH) whose mass number is 17, and FIG. 13B shows the intensity of a substance ($H_2O$) whose mass number is 18.

Figure 14A:
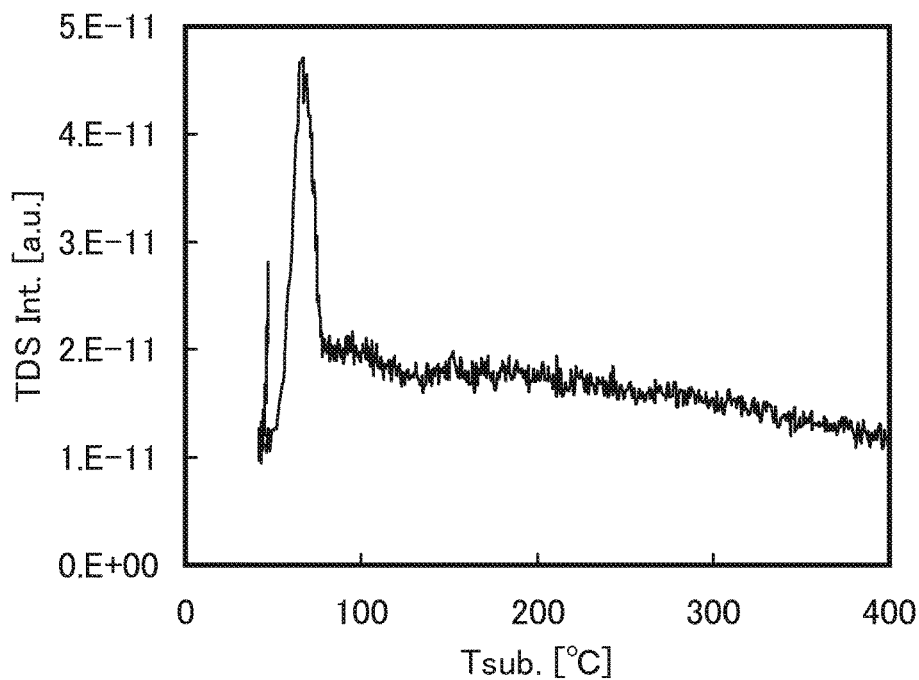
FIGS. 14A and 14B show results of thermal desorption spectroscopy performed on an oxide semiconductor film.
Figure 14B:
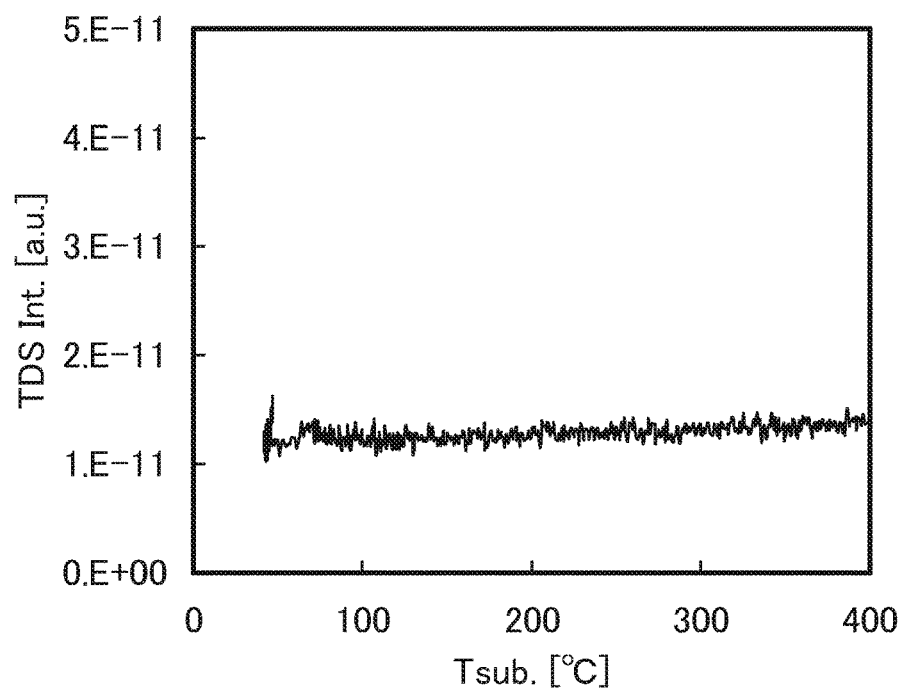
Figure 15A:
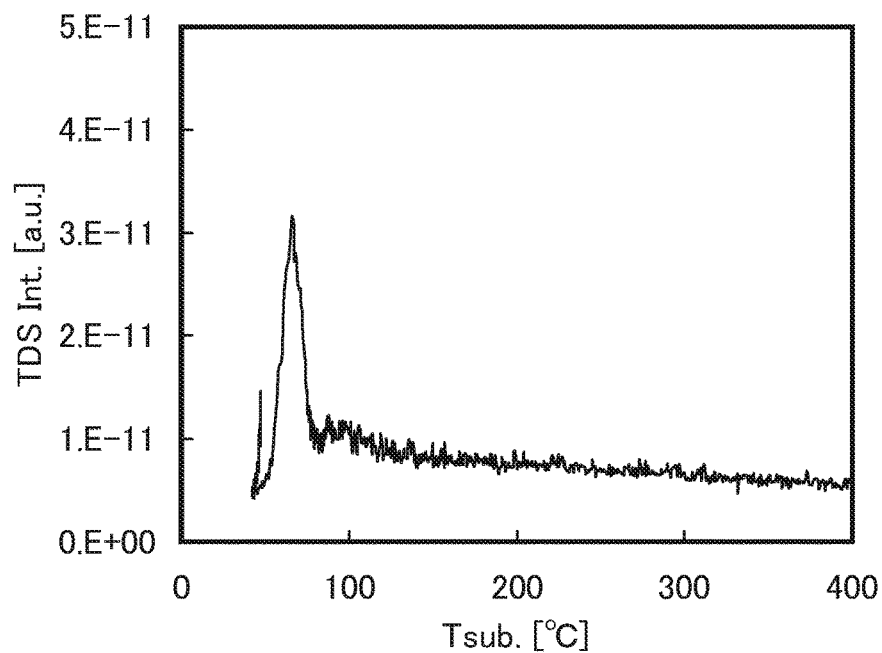
FIGS. 15A and 15B show results of thermal desorption spectroscopy performed on an oxide semiconductor film.
Figure 15B:
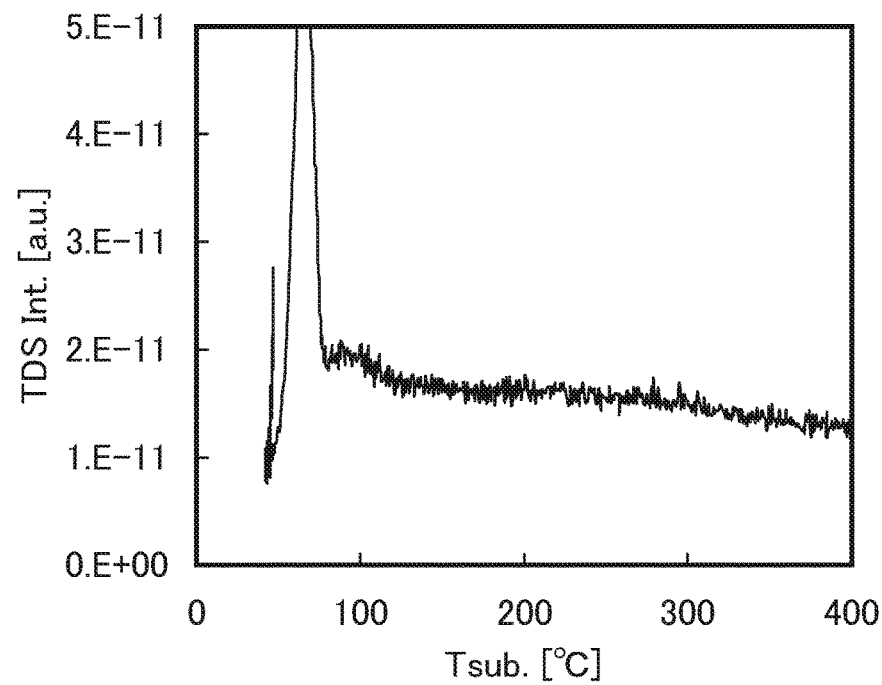

FIGS. 14A and 14B and FIGS. 15A and 15B show results in the case where the oxide semiconductor film was formed at 400° C. FIG. 14A shows the intensity of a substance (H) whose mass number is 1, FIG. 14B shows the intensity of a substance ($H_2$) whose mass number is 2, FIG. 15A shows the intensity of a substance (OH) whose mass number is 17, and FIG. 15B shows the intensity of a substance ($H_2O$) whose mass number is 18.

In the case of the substance (H) whose mass number is 1, a peak was detected around 250° C. in the oxide semiconductor film formed at room temperature which is shown in FIG. 10A. The oxide semiconductor film formed at 200° C. which is shown in FIG. 12A had a lower peak than the peak of the oxide semiconductor film formed at room temperature. In contrast, in the oxide semiconductor film formed at 400° C. which is shown in FIG. 14A, a peak was hardly detected.

In the case of the substance ($H_2$) whose mass number is 2, a peak was hardly detected in any of the oxide semiconductor film formed at room temperature which is shown in FIG. 10B, the oxide semiconductor film formed at 200° C. which is shown in FIG. 12B, and the oxide semiconductor film formed at 400° C. which is shown in FIG. 14B.

In the case of the substance (OH) whose mass number is 17, a peak was detected around 300° C. in each of the oxide semiconductor film formed at room temperature which is shown in FIG. 11A and the oxide semiconductor film formed at 200° C. which is shown in FIG. 13A, whereas a peak was hardly detected in the oxide semiconductor film formed at 400° C. which is shown in FIG. 15A.

In the case of the substance ($H_2O$) whose mass number is 18, a peak was detected around 300° C. in each of the oxide semiconductor film formed at room temperature which is shown in FIG. 11B and the oxide semiconductor film formed at 200° C. which is shown in FIG. 13B, whereas a peak was hardly detected in the oxide semiconductor film formed at 400° C. which is shown in FIG. 15B.

Next, results of calculating the number of water molecules by using the results of thermal desorption spectroscopy which are shown in FIG. 11B, FIG. 13B, and FIG. 15B will be described.

The number of water molecules can be calculated from an integral value of the peak intensity in respective TDS spectrums shown in FIG. 11B, FIG. 13B, and FIG. 15B. That is to say, the amount of eliminated water molecules can be calculated by using the integral value of the peak intensity in the respective TDS spectrums and a reference value obtained from a reference sample.

For example, the amount of water molecules ($N_{H2O}$) eliminated from an oxide semiconductor film can be calculated from a TDS spectrum of the reference sample and the TDS spectrum of the oxide semiconductor film, using the following mathematical formula 1.

$$N_{H2O} = N_{H2}/S_{H2} \times S_{H2O} + \alpha \quad \text{(mathematical formula 1)}$$

$N_{H2}$ is a value obtained by conversion of the number of hydrogen molecules ($H_2$) eliminated from the reference sample into a density. $S_{H2}$ is an integral value of a TDS spectrum of hydrogen molecules ($H_2$) in the reference sample. That is, $N_{H2}/S_{H2}$ is the reference value of the reference sample. $S_{H2O}$ is an integral value of the TDS spectrum of water molecules ($H_2O$) in the oxide semiconductor film. $\alpha$ is a coefficient which has an influence on the TDS spectrum intensity. As for details of the mathematical formula 1, Japanese Published Patent Application No. H06-275697 can be referred to.

In this example, the integration value was calculated within a temperature range of higher than or equal to 150° C. and lower than or equal to 400° C. in the respective TDS spectrums shown in FIG. 11B, FIG. 13B, and FIG. 15B, and was compared with that of the reference sample, whereby the number of water molecules was calculated. Note that a silicon wafer containing hydrogen atoms at $1 \times 10^{16}$ atoms/$cm^3$ was used as the reference sample.

According to the above results, the number of water molecules ($H_2O$) was calculated in each of the oxide semiconductor films formed at room temperature, 200° C., and 400° C. and was found to be 1.06/$nm^3$, 0.31/$nm^3$, and 0.05/$nm^3$ (less than or equal to the lower detection limit), respectively. Note that measurement values of the substance (H) whose mass number is 1 and the substance (OH) whose mass number is 17 are considered to be strongly influenced by a substance derived from a water molecule. Accordingly, in the calculation of the number of water molecules, respective numbers of the substances (H) whose mass number is 1, the substances (OH) whose mass number is 17, and the like formed by dissociation of water molecules in a detector were taken into consideration.

Through the above results, it was found that as the temperature of formation of the In—Ga—Zn—O-based non-single-crystal film gets higher, impurities such as water, OH, or H eliminated from the In—Ga—Zn—O-based non-single-crystal film is reduced. It was also found that the oxide semiconductor film formed at 400° C. hardly includes impurities other than its main components so as to be highly purified as deposition.

When such a highly purified oxide semiconductor film is used for a transistor, a transistor with stable electric characteristics can be obtained.

This application is based on Japanese Patent Application serial no. 2010-117373 filed with Japan Patent Office on May 21, 2010, the entire contents of which are hereby incorporated by reference.

The invention claimed is:

1. A method for manufacturing a semiconductor device comprising the steps of:
   forming an oxide semiconductor film, the oxide semiconductor film serving as a channel formation region of a transistor;
   performing an oxygen doping treatment on the oxide semiconductor film; and
   forming a source electrode and a drain electrode over and in contact with the oxide semiconductor film, the source electrode and the drain electrode each comprising tantalum nitride,
   wherein the oxide semiconductor film is formed by a sputtering method at a temperature higher than 300° C. and lower than or equal to 500° C. so that the number of water molecules eliminated from the oxide semiconductor film is 0.5/$nm^3$ or less according to thermal desorption spectroscopy and a carrier density of the oxide semiconductor film is less than $1 \times 10^{12}$/$cm^3$.

2. The method for manufacturing a semiconductor device according to claim 1, wherein the number of water molecules eliminated from the oxide semiconductor film is 0.1/$nm^3$ or less according to thermal desorption spectroscopy.

3. The method for manufacturing a semiconductor device according to claim 1, wherein a formation atmosphere of the oxide semiconductor film is a rare gas atmosphere, an oxygen atmosphere, or a mixed atmosphere of a rare gas and oxygen.

4. The method for manufacturing a semiconductor device according to claim 1, wherein the oxide semiconductor film comprises at least one of In, Ga, and Zn.

5. A method for manufacturing a semiconductor device comprising the steps of:
   forming a gate electrode over a substrate;
   forming a gate insulating film over the gate electrode;

forming an oxide semiconductor film over the gate insulating film, the oxide semiconductor film serving as a channel formation region of a transistor;

performing an oxygen doping treatment on the oxide semiconductor film; and forming a source electrode and a drain electrode over and in contact with the oxide semiconductor film, the source electrode and the drain electrode each comprising tantalum nitride, wherein the oxide semiconductor film is formed by a sputtering method at a temperature higher than 300° C. and lower than or equal to 500° C. so that the number of water molecules eliminated from the oxide semiconductor film is $0.5/nm^3$ or less according to thermal desorption spectroscopy and a carrier density of the oxide semiconductor film is less than $1\times10^{12}/cm^3$.

6. The method for manufacturing a semiconductor device according to claim 5, wherein the number of water molecules eliminated from the oxide semiconductor film is $0.1/nm^3$ or less according to thermal desorption spectroscopy.

7. The method for manufacturing a semiconductor device according to claim 5, wherein a formation atmosphere of the oxide semiconductor film is a rare gas atmosphere, an oxygen atmosphere, or a mixed atmosphere of a rare gas and oxygen.

8. The method for manufacturing a semiconductor device according to claim 5, wherein the oxide semiconductor film comprises at least one of In, Ga, and Zn.

9. The method for manufacturing a semiconductor device according to claim 5, further comprising a step of forming an insulating film over and in contact with the source electrode and the drain electrode, the insulating film comprising aluminum oxide.

10. A method for manufacturing a semiconductor device comprising the steps of:

forming an oxide semiconductor film, the oxide semiconductor film serving as a channel formation region of a transistor;

performing an oxygen doping treatment on the oxide semiconductor film; and forming a source electrode and a drain electrode over and in contact with the oxide semiconductor film, wherein the oxide semiconductor film is formed by a sputtering method at a temperature higher than 300° C. and lower than or equal to 500° C. so that the number of water molecules eliminated from the oxide semiconductor film is $0.5/nm^3$ or less according to thermal desorption spectroscopy and a carrier density of the oxide semiconductor film is less than $1\times10^{12}/cm^3$.

11. The method for manufacturing a semiconductor device according to claim 10, wherein the number of water molecules eliminated from the oxide semiconductor film is $0.1/nm^3$ or less according to thermal desorption spectroscopy.

12. The method for manufacturing a semiconductor device according to claim 10, wherein a formation atmosphere of the oxide semiconductor film is a rare gas atmosphere, an oxygen atmosphere, or a mixed atmosphere of a rare gas and oxygen.

13. The method for manufacturing a semiconductor device according to claim 10, wherein the oxide semiconductor film comprises at least one of In, Ga, and Zn.

* * * * *